(12) United States Patent
Huang

(10) Patent No.: US 10,170,332 B2
(45) Date of Patent: Jan. 1, 2019

(54) FINFET THERMAL PROTECTION METHODS AND RELATED STRUCTURES

(71) Applicant: TAIWAN SEMICONDUCTOR MANUFACTURING COMPANY, LTD., Hsin-Chu (TW)

(72) Inventor: Yu-Lien Huang, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 194 days.

(21) Appl. No.: 14/319,610

(22) Filed: Jun. 30, 2014

(65) Prior Publication Data

US 2015/0380558 A1 Dec. 31, 2015

(51) Int. Cl.
*H01L 29/00* (2006.01)
*H01L 21/00* (2006.01)
(Continued)

(52) U.S. Cl.
CPC .... *H01L 21/31053* (2013.01); *H01L 29/1054* (2013.01); *H01L 29/66545* (2013.01);
(Continued)

(58) Field of Classification Search
CPC ..... H01L 21/823412; H01L 21/823418; H01L 29/1025; H01L 29/1029; H01L 29/1033;
(Continued)

(56) References Cited

U.S. PATENT DOCUMENTS 6,383,906 B1 * 5/2002 Wieczorek et al. .......... 438/592
6,828,188 B2 * 12/2004 Hirota ............... H01L 27/10894
257/E21.649

(Continued)

FOREIGN PATENT DOCUMENTS

| CN | 103035712 | | 4/2013 |
|----|-----------|---|--------|
| GB | 2365212 | * | 2/2002 |
| WO | WO2013053085 | | 4/2013 |

OTHER PUBLICATIONS

Rinus T.P. Lee, R.J.W. Hill, W.-Y. Loh, R.-H. Baek, S. Deora, K. Matthews, C. Huffman, K. Majumdar, T. Michalak, C. Borst, P.Y. Hung, C.-H. Chen, J.-H. Yum, T.-W. Kim, C.Y. Kang, Wei-E Wang, D.-H. Kim, C. Hobbs and P.D. Kirsch; "VLSI Processed InGaAs on Si MOSFETs with Thermally Stable, Self-Aligned Ni—InGaAs Contacts Achieving:Enhanced Drive Current and Pathway Towards a Unified Contact Module;" 2013 IEEE; IEDM13-44; p. 2.6.1-p. 2.6.4; SEMATECH; 257 Fuller Road, Suite 2200, Albany, NY 12203; USA.

(Continued)

*Primary Examiner* — Dale E Page
*Assistant Examiner* — Quovaunda V Jefferson
(74) *Attorney, Agent, or Firm* — Haynes and Boone, LLP

(57) ABSTRACT

A method and structure for protecting high-mobility materials from exposure to high temperature processes includes providing a substrate having at least one fin extending therefrom. The at least one fin includes a dummy channel and source/drain regions. A dummy gate stack is formed over the dummy channel. A first inter-layer dielectric (ILD) layer is formed on the substrate including the fin. The first ILD layer is planarized to expose the dummy gate stack. After planarizing the first ILD layer, the dummy gate stack and the dummy channel are removed to form a recess, and a high-mobility material channel region is formed in the recess. After forming the high-mobility material channel region, contact openings are formed within a second ILD layer overlying the source/drain regions, and a low Schottky barrier height (SBH) material is formed over the source/drain regions.

20 Claims, 25 Drawing Sheets

(51) Int. Cl.
  *H01L 21/3105* (2006.01)
  *H01L 29/66* (2006.01)
  *H01L 29/78* (2006.01)
  *H01L 29/10* (2006.01)
  *H01L 21/324* (2006.01)

(52) U.S. Cl.
  CPC ...... *H01L 29/66795* (2013.01); *H01L 29/785* (2013.01); *H01L 21/324* (2013.01)

(58) Field of Classification Search
  CPC ........... H01L 29/7851; H01L 29/66795; H01L 29/66545; H01L 29/267; H01L 29/20; H01L 21/02546; H01L 21/324; H01L 21/31053; H01L 29/1054; H01L 29/105; H01L 21/310534
  See application file for complete search history.

(56) References Cited

U.S. PATENT DOCUMENTS

| | | | | |
|---|---|---|---|---|
| 7,682,887 | B2* | 3/2010 | Dokumaci | H01L 21/26506 257/E29.27 |
| 8,304,319 | B2* | 11/2012 | Nieh | H01L 29/665 257/E21.199 |
| 9,224,840 | B2 | 12/2015 | Flachowsky et al. | |
| 2002/0001930 | A1* | 1/2002 | Lee | 438/585 |
| 2002/0008261 | A1* | 1/2002 | Nishiyama | 257/288 |
| 2005/0003593 | A1* | 1/2005 | Krivokapic | 438/158 |
| 2007/0145487 | A1* | 6/2007 | Kavalieros | H01L 29/66628 257/368 |
| 2009/0065809 | A1* | 3/2009 | Yamakawa | 257/190 |
| 2010/0252862 | A1* | 10/2010 | Ko | H01L 29/1054 257/192 |
| 2011/0227170 | A1* | 9/2011 | Zhu et al. | 257/410 |
| 2012/0168877 | A1* | 7/2012 | Mukherjee | H01L 29/66446 257/401 |
| 2013/0161694 | A1 | 6/2013 | Adam et al. | |
| 2013/0270628 | A1* | 10/2013 | Huang | H01L 29/0847 257/329 |
| 2013/0285141 | A1* | 10/2013 | Kuo | H01L 29/66545 257/347 |
| 2013/0334606 | A1 | 12/2013 | Shen et al. | |
| 2014/0027816 | A1* | 1/2014 | Cea | H01L 29/66545 257/192 |

OTHER PUBLICATIONS

A. Dobbie, M. Myronov, Xue-Chao Liu, Van H. Nguyen, E. H. C. Parker and D. R. Leadley; "Investigation of the Thermal Stability of Strained Ge Layers Grown at Low Temperature by Reduced-Pressure Chemical Vapour Deposition on Relaxed Si0.2Ge0.8 Buffers;" Mater. Res. Soc. Symp. Proc. vol. 1252 © 2010 Materials Research Society; 1252-I04-06.

Korean Intellectual Property Office, Korean Office Action dated Feb. 22, 2016 for Patent Application No. 10-2016-0007769; 8 pgs.

* cited by examiner

300

300

FINFET THERMAL PROTECTION METHODS AND RELATED STRUCTURES

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In addition, high-mobility materials are being researched. However, existing semiconductor process flows require high-temperature processing during various steps throughout the process flow, such as during oxide anneals, silicon nitride deposition, or during dopant diffusion and activation anneals, which could adversely affect high-mobility materials. In particular, high-mobility materials may not remain thermally stable at the high temperatures encountered during typical semiconductor processing, resulting in degradation of the high-mobility material as well as degraded device performance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-21A illustrate cross sectional views of an embodiment of a FinFET device corresponding to one or more steps of the method of FIG. 2 and are provided along a cross-sectional view substantially similar to section AA' of FIG. 1; and FIGS. 3B-21B illustrate cross sectional views of an embodiment of a FinFET device corresponding to one or more steps of the method of FIG. 2 and are provided along cross-sectional view substantially similar to section BB' of FIG. 1.

DETAILED DESCRIPTION

Figure 1:
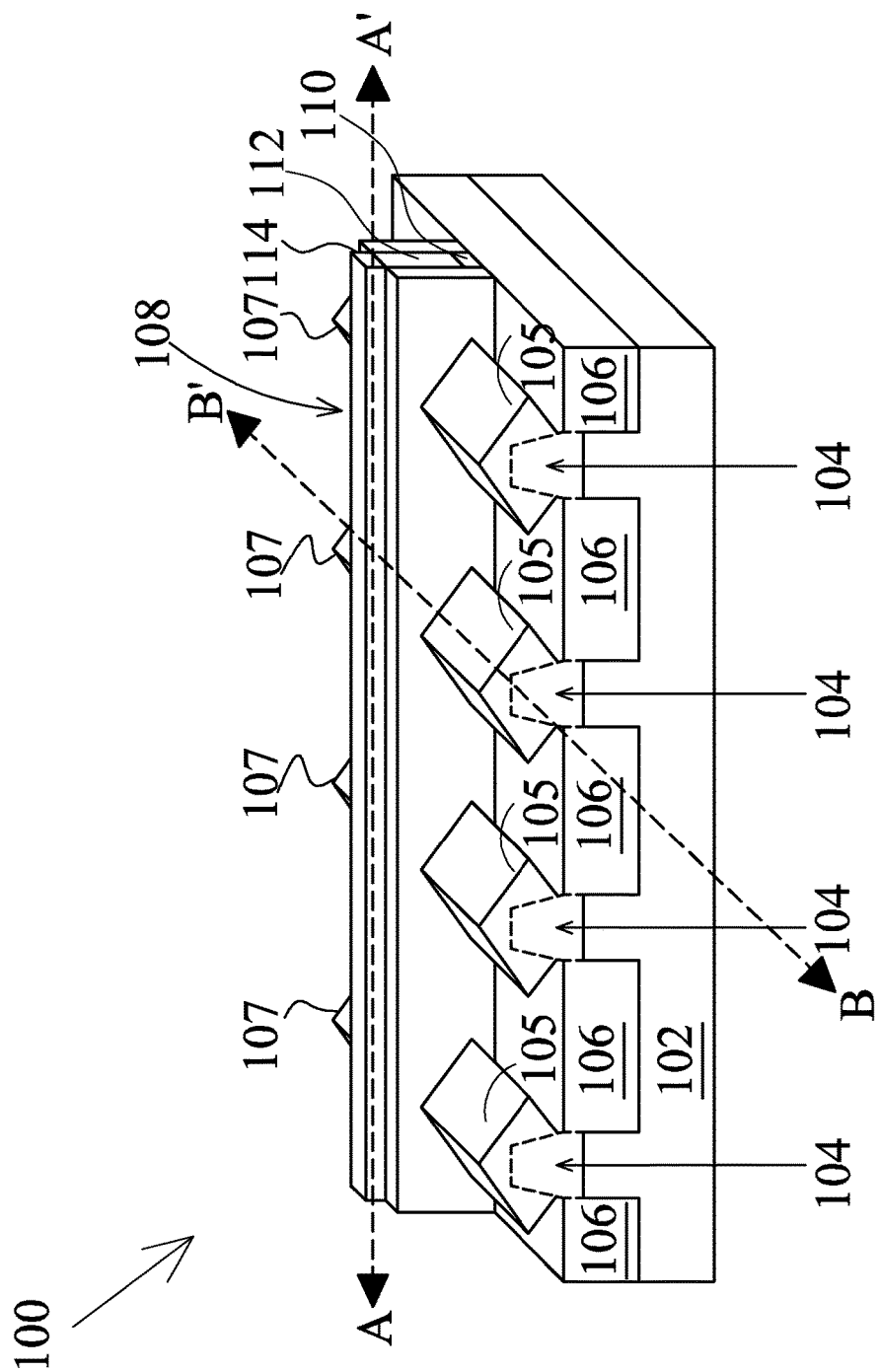
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. In some embodiments, one or more layers of a low Schottky barrier height (SBH) material are formed over the source/drain regions 105, 107 to reduce a source/drain contact resistance. In some examples, the low SBH material includes a III-V material such as GaAs, $In_xGa_{1-x}As$, Ni—InAs, and/or other suitable materials. A channel region of a transistor is disposed within the fin 104, underlying the gate structure 108, along a plane substantially parallel to a plane defined by section BB' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2$/V-s and a hole mobility of around 480 $cm^2$/V-s.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack having an interfacial layer 110 formed over the channel region of the fin 104, a gate dielectric layer 112 formed over the interfacial layer 110, and a metal layer 114 formed over the gate dielectric layer 112. The interfacial layer 110 may include a dielectric material such as silicon oxide layer ($SiO_2$) or silicon oxynitride (SiON). The interfacial layer 110 may be formed by chemical oxidation, thermal oxidation, atomic layer deposition (ALD), chemical vapor deposition (CVD), and/or other suitable method. The gate dielectric layer 112 may include a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, combinations thereof, or other suitable material. In still other embodiments, the gate dielectric layer may include silicon dioxide or other suitable dielectric. The dielectric layer may be formed by ALD, physical vapor deposition (PVD), oxidation, and/or other suitable methods. The metal layer 114 may include a conductive layer such as W, TiN, TaN, WN, Re, Ir, Ru, Mo, Al, Cu, Co, Ni, combinations thereof, and/or other suitable compositions. In some embodiments, the metal layer 114 may include a first metal material for N-type FinFETs and a second metal material for P-type FinFETs. Thus the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 114 may provide a gate electrode for the FinFET device 100, including both N-type and P-type FinFET devices 100. In some embodiments, the metal layer 114 may alternately include a polysilicon layer. The metal layer 114 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

The use of high-mobility materials, for example as silicon-channel replacements, has gained considerable interest due to their high intrinsic electron and/or hole mobility as compared to silicon. Advantages of using materials with high intrinsic mobility include higher device drive current, reduced intrinsic delay, improved high-frequency performance (e.g., for radio-frequency applications), as well as other benefits as known in the art. As discussed above, high-mobility materials (e.g., III-V semiconductor materials) may also be used in the transistor source/drain regions 105, 107 to provide a low SBH layer between the source/drain semiconductor material and a source/drain contact metal, thereby reducing the source/drain contact resistance.

While there are clear advantages to using high-mobility materials, existing semiconductor process flows employ high thermal budget processing during various steps throughout the fabrication of a semiconductor device, such as during oxide anneals, silicon nitride deposition, and/or during dopant diffusion and activation anneals, which can adversely affect high-mobility materials. The term "thermal budget", as used herein, is used to define an amount of thermal energy transferred (e.g., to a semiconductor wafer during a high-temperature process) and is given as a product of temperature (e.g., in degrees Kelvin) and time (e.g., in seconds). Low thermal budget processes are preferred, for example, to prevent dopant redistribution or electromigration. Moreover, the thermal instability of some high-mobility materials at the high temperatures encountered during typical semiconductor processing may result in relaxation of strained layers (e.g., relaxation of strained Ge layers), increased surface roughness, formation of misfit dislocations, and/or other degradation mechanisms, which can lead to increased carrier scattering, increased resistance, lower mobility, and degraded transistor performance. As used herein, the term "high temperature" refers to temperatures greater than about 550° C., where such temperatures may result in thermal instability and related degradation of high-mobility materials as discussed above. Thus, the various embodiments described herein provide methods for protecting and/or avoiding exposure of high-mobility materials to high-temperature (e.g., greater than about 550° C.) semiconductor processes.

Figure 2:
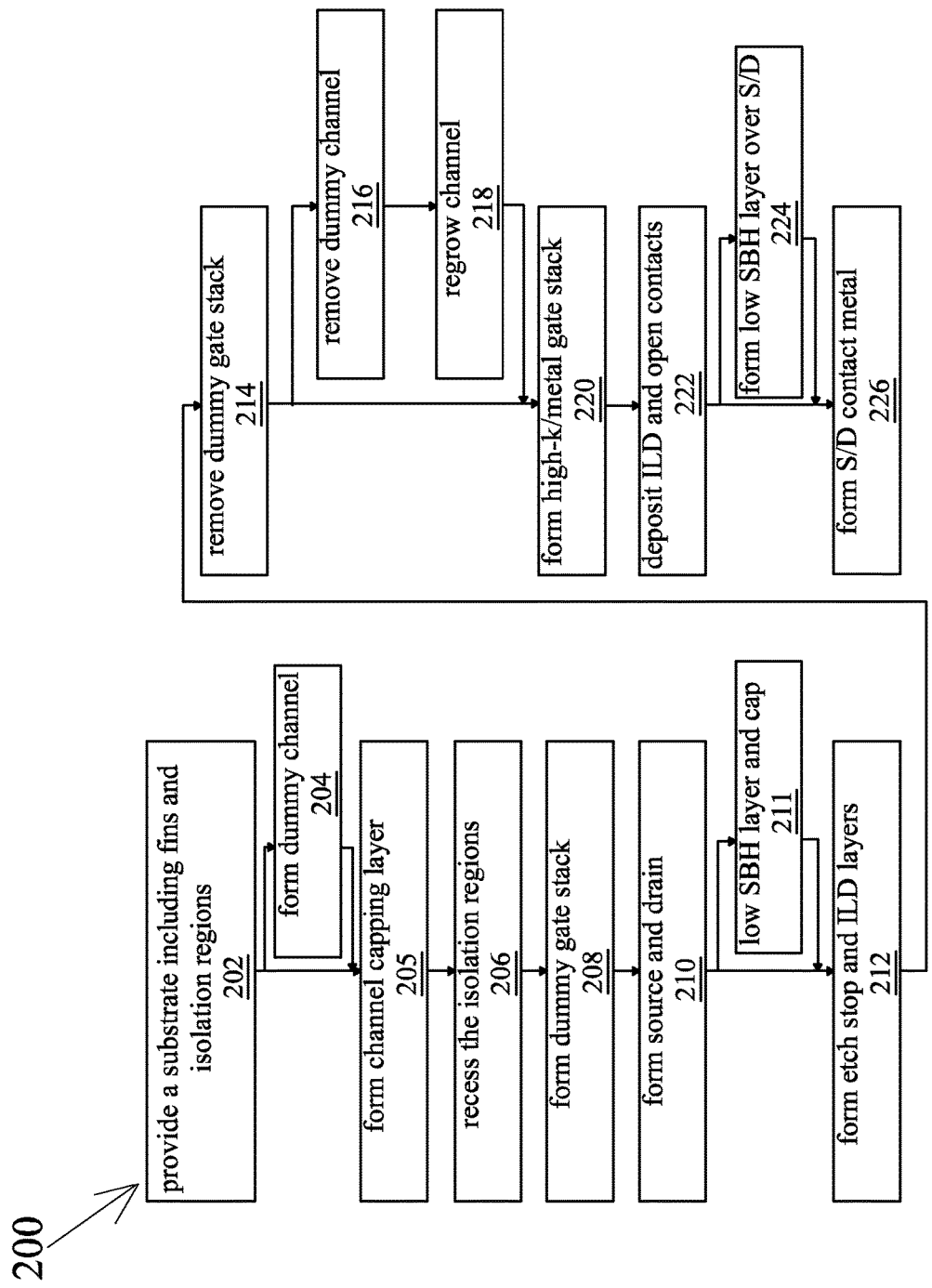
FIG. 2 is a flow chart of a method of fabricating a FinFET device according to one or more aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and systems for protecting high-mobility materials from exposure to high thermal budget process, so as to minimize degradation of such materials. In some embodiments, a high-mobility transistor channel layer (e.g., a III-V layer, a Ge layer, a SiGe$_x$ layer, or other high-mobility layer) is formed at a late stage of a transistor fabrication process flow, in order to reduce exposure of the high-mobility channel layer to the high thermal budget processes encountered during various fabrication stages. In some examples, a high-mobility SBH layer is formed at a late stage of transistor fabrication, in order to prevent exposure of the SBH layer to high temperatures. In yet other examples, both the high-mobility transistor channel layer and the high-mobility SBH layer are formed at a late stage of a transistor fabrication process flow. Alternatively, in some embodiments, a capping layer may be formed over the high-mobility transistor channel layer and/or the high-mobility SBH layer, for example to prevent outgassing of the layer. In some embodiments, the capping layer may include a Si layer, a dielectric layer (e.g., SiO$_2$), a nitride layer (e.g., Si$_3$N$_4$), and/or other suitable material. In various embodiments, the capping layer may be formed by an in-situ or ex-situ process. Referring now to FIG. 2, illustrated is a method 200 of fabricating a semiconductor device including a FinFET device. The method 200 may be used to implement a fin-based semiconductor device including methods for protecting high-mobility materials from exposure to high thermal budget processes. In some embodiments, the method 200 may be used to fabricate the device 100, described above with reference to FIG. 1. Thus, one or more aspects discussed above may also apply to the method 200. Additionally, FIGS. 3A/3B-21A/21B are cross-sectional views of an exemplary device 300 fabricated according to one or more steps of the method 200 of FIG. 2.

It is understood that parts of the method 200 and/or the semiconductor device 300 may be fabricated by a well-known complementary metal-oxide-semiconductor (CMOS) technology process flow, and thus some processes are only briefly described herein. Further, the semiconductor device 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 300 includes a plurality of semiconductor devices (e.g., transistors), which may be interconnected.

The device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Referring now to the method 200, the method 200 begins at block 202 where a substrate including fins and isolation regions is provided. The substrate may be substantially similar to the substrate discussed above with reference to FIG. 1. The fins and isolation regions may also be substantially similar to the fin elements 104 and isolation regions 106, also described above with reference the device 100 of FIG. 1.

Figure 3A:
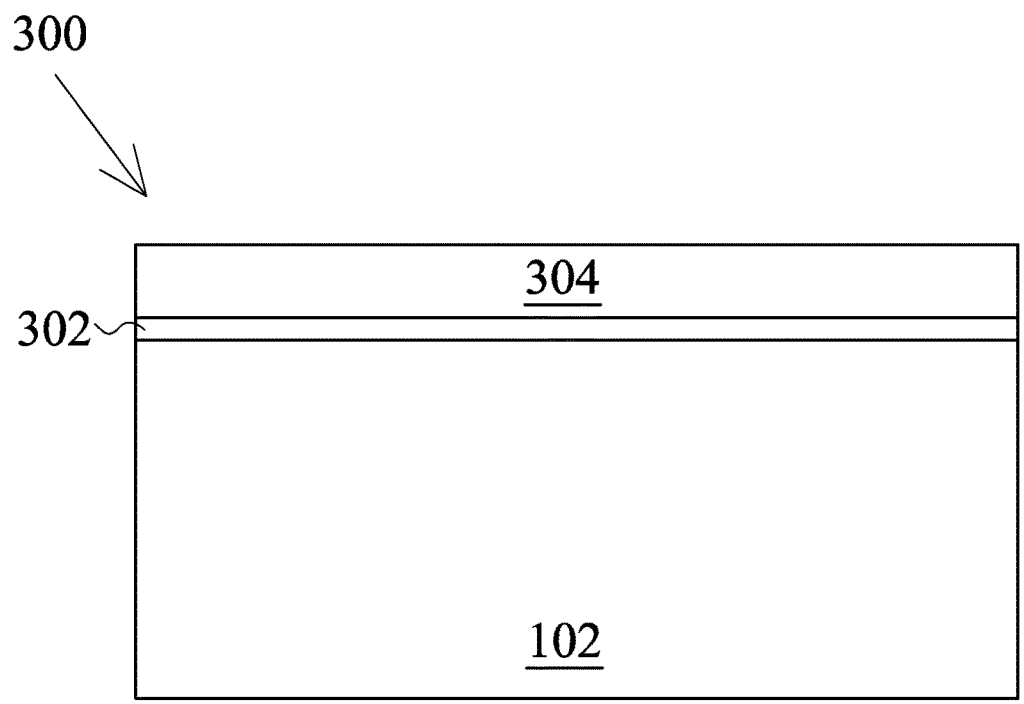
Figure 3B:
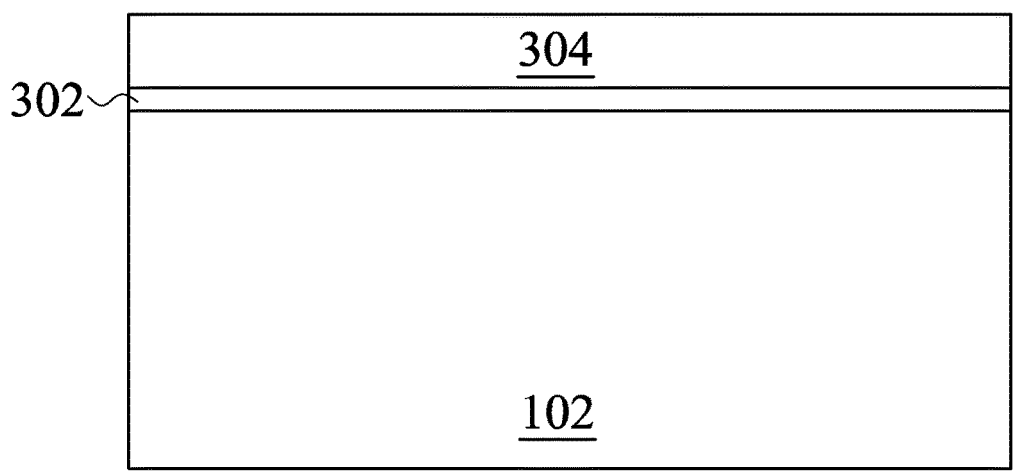

Referring to the example of FIGS. 3A/3B, illustrated is a semiconductor device 300 including a semiconductor substrate 102, a first dielectric layer 302 formed over the semiconductor substrate 102, and a second dielectric layer 304 formed over the first dielectric layer 302. In some embodiments, the first dielectric layer 302 includes a pad oxide layer (e.g., SiO$_2$) which may be used as a buffer layer between adjacent layers. In some embodiments, the first dielectric layer 302 includes thermally grown oxide, CVD-deposited oxide, and/or ALD-deposited oxide. By way of example, the first dielectric layer 302 may have a thickness of between approximately 5 nm and approximately 40 nm. In some embodiments, the second dielectric layer 304 includes a pad nitride layer (e.g., Si$_3$N$_4$). The second dielectric layer 304 may be deposited by CVD or other suitable technique, and in some examples the second dielectric layer 304 may have a thickness of between approximately 20 nm and approximately 160 nm.

Figure 4A:
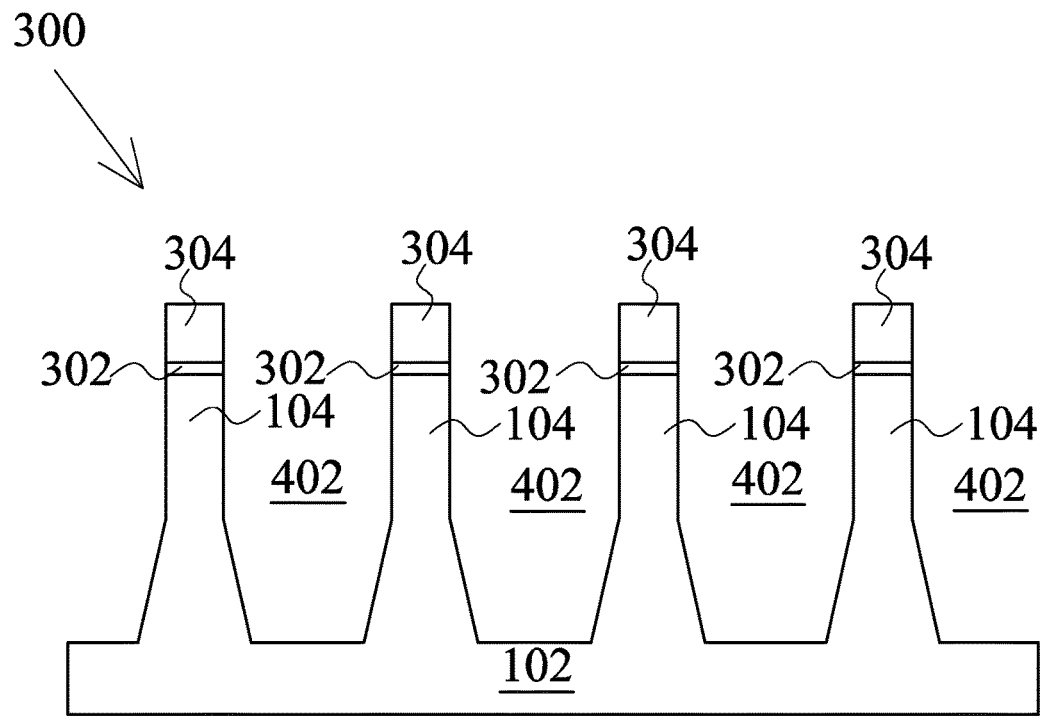
Figure 4B:
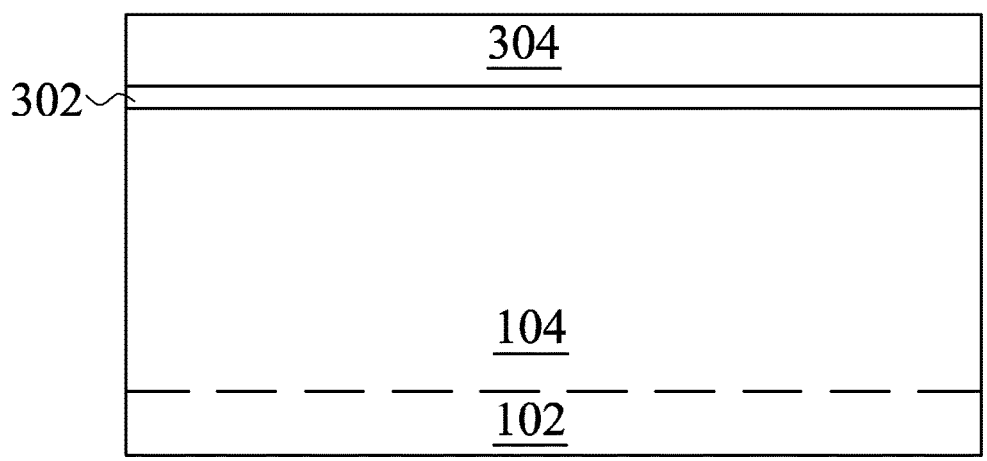
Figure 5A:
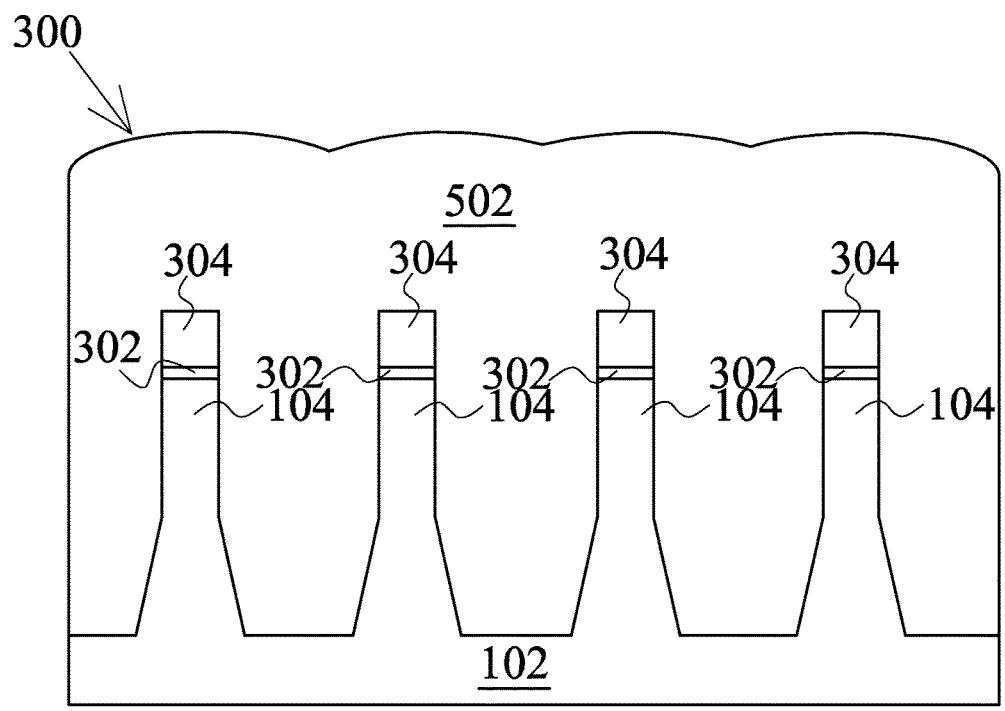
Figure 5B:
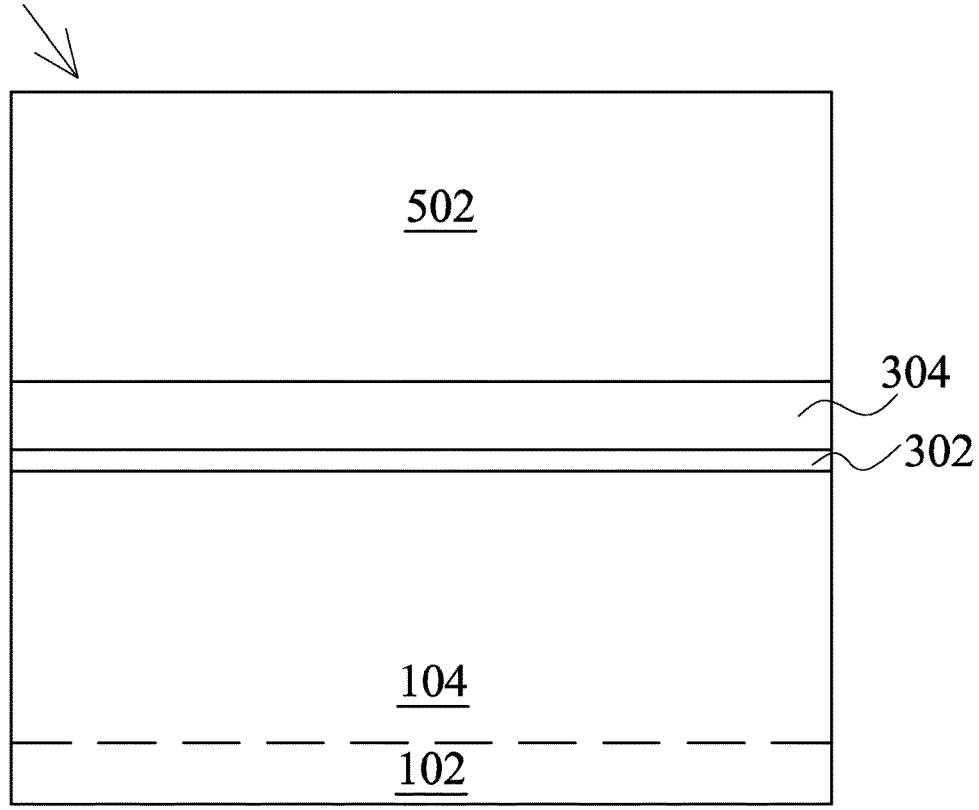
Figure 6A:
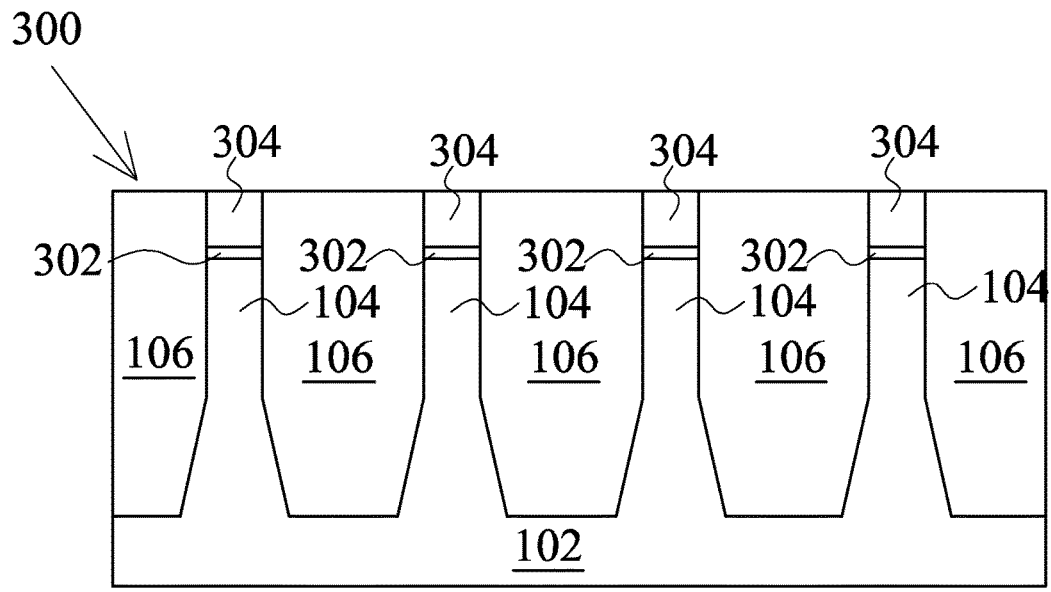
Figure 6B:
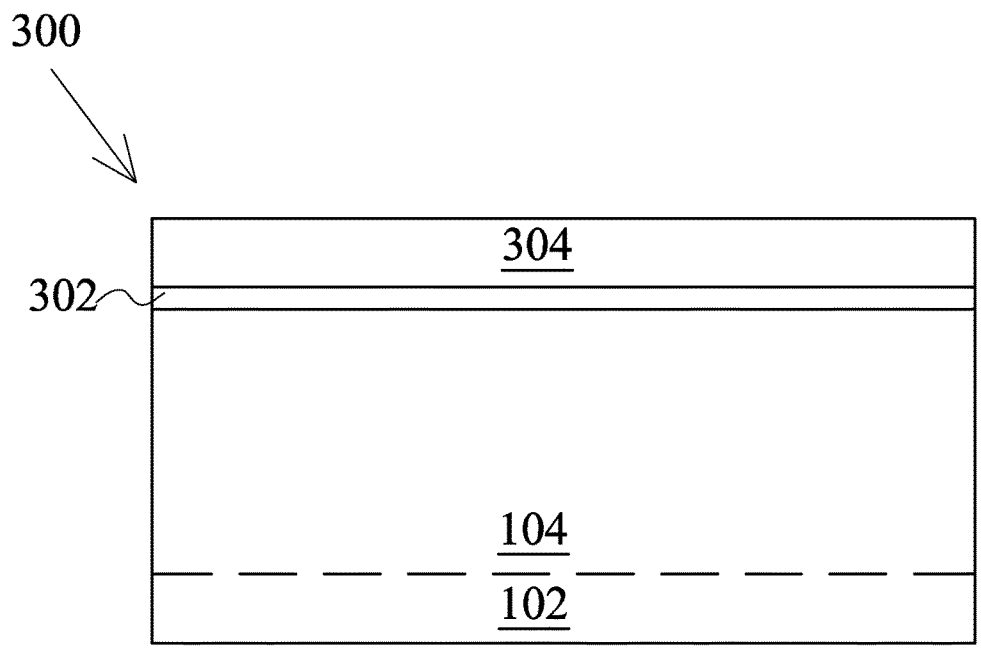

Referring to FIGS. 4A/4B, 5A/5B, 6A/6B, and/or 7A/7B, illustrated is an embodiment of forming fins and interposing dielectric features. It is noted that these process steps are exemplary only and not intended to be limiting beyond what is specifically recited in the claims that follow. For example, other methods of forming fins and/or dielectric features in the substrate would be recognized by one of ordinary skill in the art. In an embodiment, fins 104 are patterned and etched in the substrate 102. The fins 104 may be patterned by photolithography or e-beam lithography, as described above, followed by etching using a dry etch (e.g., RIE, ICP), wet etch, or other suitable process. The etching process defines the plurality of fins 104 extending from the substrate 102 as well as trenches 402 disposed between the fins 104. The trenches 402 are subsequently used to form isolation regions, such as STI isolation regions 106 (FIG. 1). Referring to FIGS. 5A/5B, a dielectric 502 is deposited over the substrate 102, thereby filling the trenches 402 with the dielectric 502. In some embodiments, the dielectric 502 includes SiO$_2$ silicon nitride, silicon oxynitride, other suitable materials, or combinations thereof. The dielectric 502 may be deposited by CVD, ALD, PVD, or other suitable process. In some embodiments, the dielectric 502 is annealed at a temperature of about or above 1000° C. to improve the quality of the dielectric 502. As shown in FIGS. 6A/6B, a chemical mechanical polishing (CMP) process may be performed to remove excess dielectric 502 material and planarize a top surface of the semiconductor device 300, thereby forming the isolation regions (e.g., isolation regions 106). In some embodiments, the isolation regions are configured to isolate fin active regions (e.g., fins 104). In some embodiments, the isolation regions 106 interposing the fins 104 (e.g., comprised of the dielectric 502) may further include a multi-layer structure, for example, having one or more liner layers.

Figure 7A:
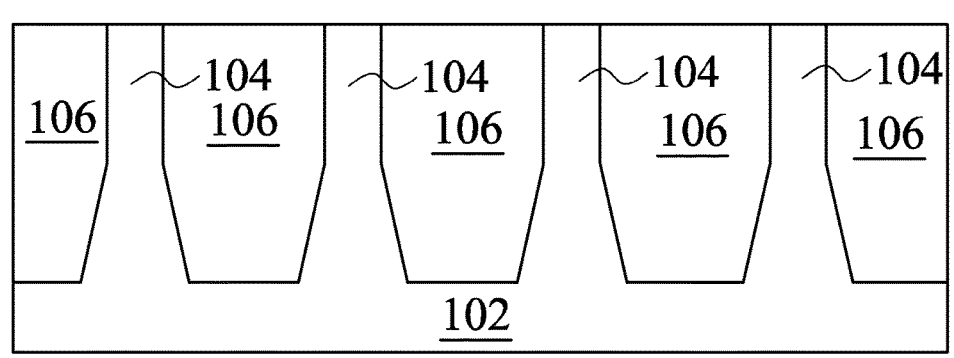
Figure 7B:
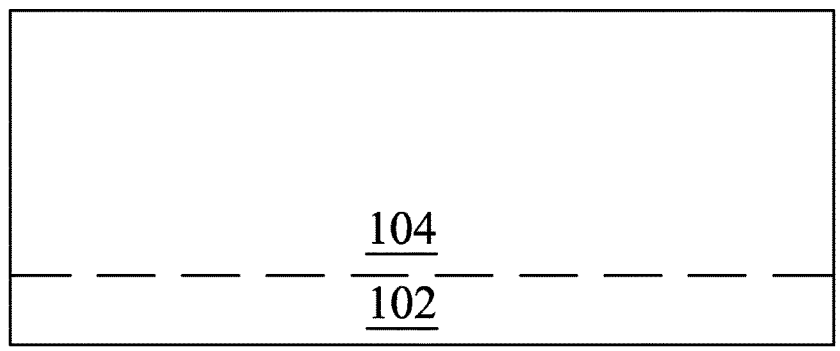

Referring to FIGS. 7A/7B, the nitride layer 304 and oxide layer 302 (from FIGS. 6A/6B) are removed, for example, by using a suitable etching process (e.g., dry or wet etching). In some embodiments, a CMP process may be performed to remove the second dielectric layer 304, the first dielectric layer 302, and planarize the top surface of the semiconductor device 300. In some embodiments, after removal of the second dielectric layer 304, and prior to removal of the first dielectric layer 302, a well implant may be performed, for example using an ion implantation process and employing a suitable N-type or P-type dopant. In some embodiments the N-type dopant includes arsenic, phosphorous, antimony, or other N-type donor material. In some embodiments, the P-type dopant includes boron, aluminum, gallium, indium, or other P-type acceptor material. In some embodiments, similar N-type or P-type dopants may be used to perform anti-punch through (APT) ion implantation through the fins 104. Such APT implants may help to reduce sub-threshold source-to-drain leakage as well as drain-induced barrier lowering (DIBL). In some embodiments, other ion implant processes may also be performed, such as a threshold voltage ($V_t$) adjust implant, a halo implant, or other suitable implant. After an ion implantation process, the semiconductor device 300 may be subjected to a high temperature anneal, for example greater than approximately 800° C., in order to remove defects and activate dopants (i.e., to place dopants into substitutional sites).

Thus, block 202 provides a substrate having a plurality of fins and interposing dielectric isolation features. FIGS. 3A/3B-7A/7B illustrate but one embodiment of the method of fabricating these elements and other suitable methods may be possible and within the scope of the present disclosure.

In some embodiments of the method 200, for example when a high-mobility transistor channel layer (e.g., a III-V layer, a Ge layer, or other high-mobility layer) is to be formed at a late stage of the semiconductor device 300 fabrication process flow, the method 200 then proceeds to block 204 where a dummy channel is formed. In some examples, as described below, when an original material used to form the fins 104 (e.g., which is the same as the substrate 102 material) is to be retained throughout the semiconductor device 300 fabrication process flow, then the method 200 may proceed directly to block 205.

Figure 8A:
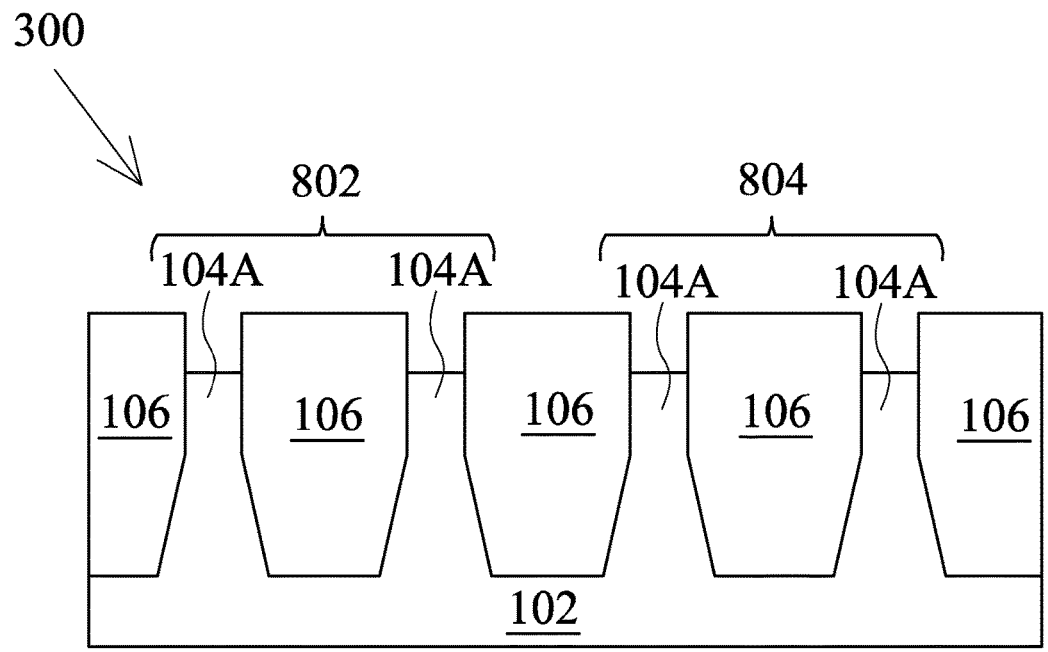
Figure 8B:
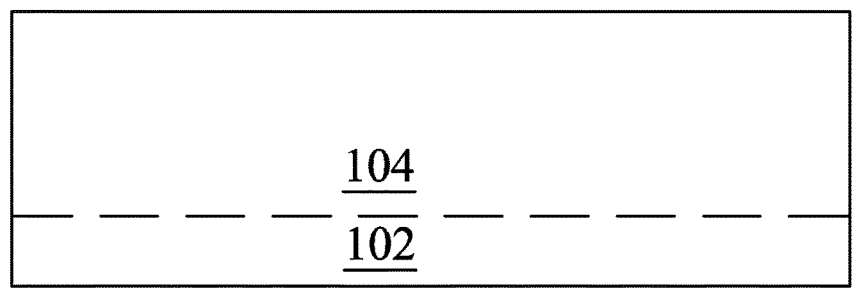

In an embodiment, the method 200 proceeds to block 204 where a dummy channel is formed in the fin structure. In general, as used herein, a "dummy" structure, such as a dummy channel, is to be understood as referring to a structure which is utilized to mimic a physical property of another structure (e.g., such as to mimic the physical dimensions of a channel, a gate, and/or other structure), and which is circuit inoperable (i.e., which is not part of a circuit current flow path) in the final fabricated device. In various embodiments, a "dummy" structure may comprise a single layer or a combination of multiple layers. Referring to the example of FIGS. 8A/8B and 9A/9B, an embodiment of forming the dummy channel is illustrated. As illustrated in FIGS. 8A/8B, a top portion of the fins 104 is recessed, resulting in recessed fins 104A. The recessing process may include a dry etching process, a wet etching process, and/or a combination thereof. Depending on the type of semiconductor material used for each of the fins 104, recessing of the all fins 104 may be done simultaneously or some fins 104 (e.g., of fin group 802) may be recessed in one process step, and other fins 104 (e.g., of fin group 804) may be recessed in another process step. In some embodiments, for example if all fins 104 comprise the same type of semiconductor material, then all fins 104 may be recessed simultaneously. In some examples, fin group 802 may include an N-type fin material (i.e., N-type channel material), fin group 804 may include a P-type fin material (i.e., P-type channel material). In a further embodiment, each of fin groups 802, 804 may be recessed using separate process steps. For example, a masking layer may be formed over one fin group 802, 804 while the other fin group is recessed. In some examples, both fin groups 802, 804 may be recessed simultaneously even if they comprise different types of fin material (i.e., channel material). In some embodiments, an N-type channel material includes Si or other substrate material and/or high-mobility material discussed above. In some embodiments, a P-type channel material includes SiGe, strained Ge, Ge, or other substrate material and/or high-mobility material discussed above.

Figure 9A:
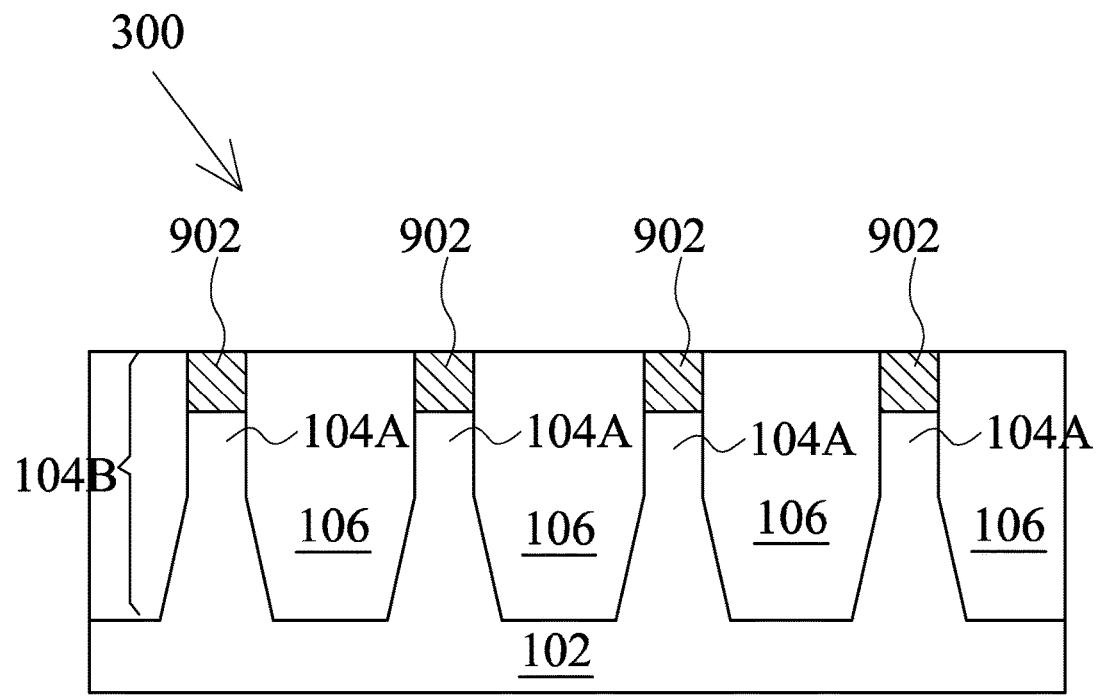
Figure 9B:
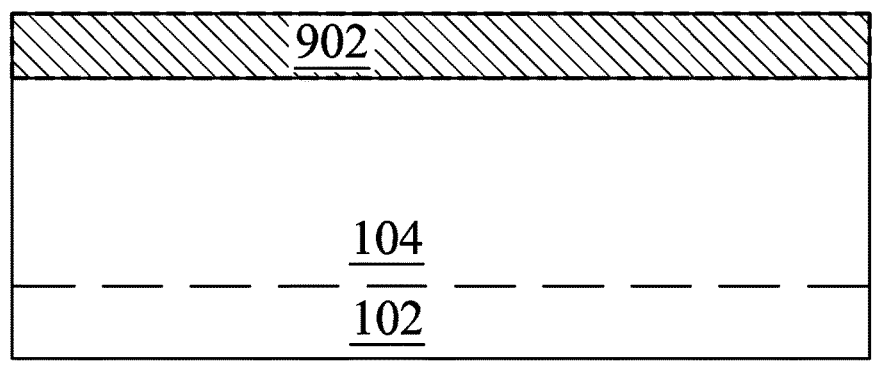

Continuing the example of block 204 of the method 200, and referring now to FIG. 9A/9B, a dummy channel 902 is formed over an end portion of recessed fins 104A, resulting in fins 104B. In some embodiments, the dummy channel 902 includes a $Si_{1-x}Ge_x$ layer, where the germanium content 'x' may be in a range of approximately 0% (pure silicon) to approximately 100% (pure germanium). However, in some examples, other materials (e.g., as listed above for the substrate 102) may be used for the dummy channel 902. In some embodiments, the dummy channel 902 may include a material having a different composition than a composition of the recessed fins 104A on which the dummy channel 902 is formed. In some examples, the dummy channel 902 may include a material having the same or similar composition as the composition of the recessed fins 104A on which the dummy channel 902 is formed. In some embodiments, the dummy channel is deposited using EPI, CVD, PVD, ALD, or other suitable process. The dummy channel 902 will be replaced by the final channel at a subsequent stage of processing of the semiconductor device 300. Particularly, the dummy channel 902 will be replaced at a later fabrication stage by a high-mobility channel material after high thermal budget processes are substantially complete as discussed in further detail below.

In an embodiment of the method 200, after formation of the dummy channel in block 204, the method 200 may bypass block 205 (capping layer formation) and proceed to block 206 where the isolation regions 106 are recessed. In some embodiments described herein, a capping layer may be used to advantageously mitigate outgassing of a high-mobility material layer and thus reduce the impact of subsequent high thermal budget processes on the high-mobility material layer. Thus, in some embodiments employing a dummy channel, such as dummy channel 902, a channel capping layer (as discussed in block 205) may not be formed for example because the dummy channel is circuit inoperable. In some examples, for example when the fin recess and dummy channel formation process of block 204 is omitted, the process may proceed directly from block 202 to block 205. For example, if an original material used to form the fins 104 (i.e., the substrate 102 material) is to be retained, then the method 200 may proceed to block 205 where a channel capping layer is formed over the transistor channel region. In some embodiments, the capping layer may include a Si layer, a dielectric layer (e.g., $SiO_2$), a nitride layer (e.g., $Si_3N_4$), and/or other suitable material. In various embodiments, the capping layer may be formed by an in-situ or ex-situ process. In some embodiments, as described above, the original fin 104 material (i.e., the substrate 102 material) may include any of a plurality of high-mobility materials, such as a III-V material, a Ge layer, or other high-mobility layer which may be degraded upon exposure to high thermal budget processes. Thus, in such embodiments, formation of the capping layer could help to prevent outgassing from such high-mobility materials. In some examples, an original material used to form the fins 104 (i.e., the substrate 102 material) is to be retained and the method 200 proceeds directly to block 205; however, formation of a channel capping layer over the transistor channel region may be omitted.

Figure 10A:
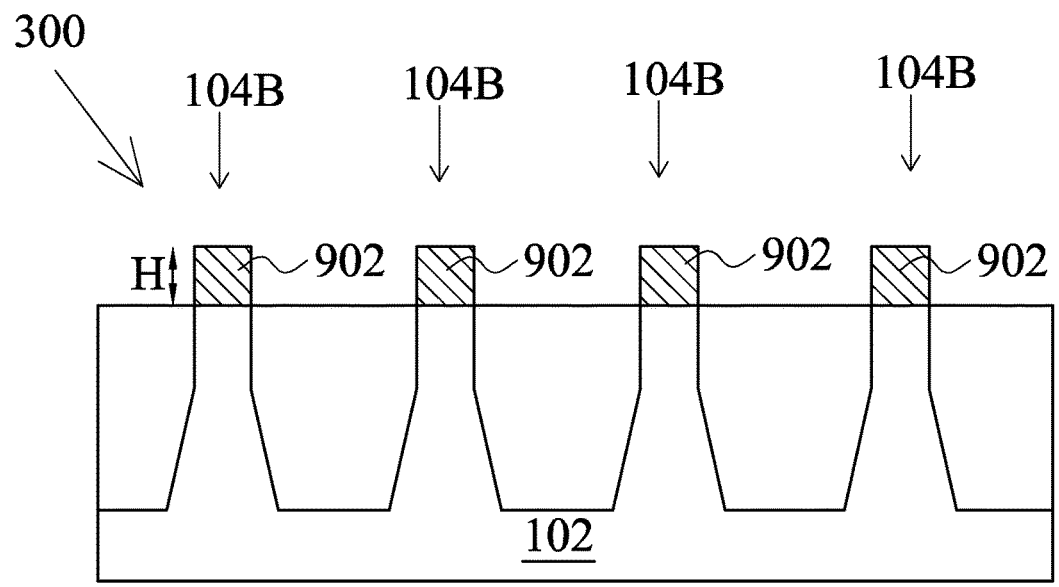
Figure 10B:
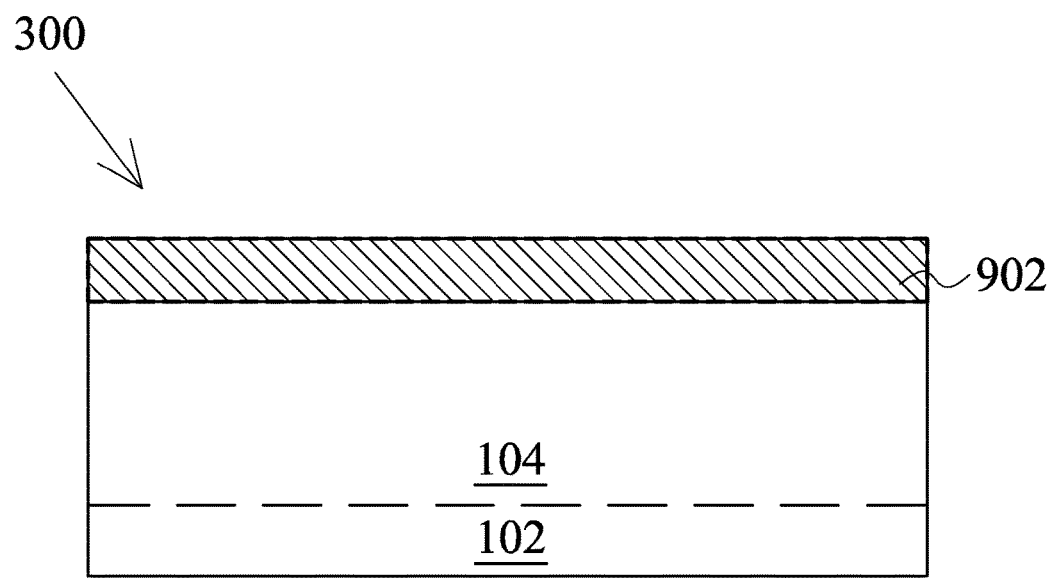

In various embodiments, with or without the dummy channel 902 and with or without the capping layer, method 200 continues at block 206 where the isolation regions around the fins are recessed. Referring to the example of FIG. 10A/10B, the isolation regions 106 around the fins 104B are recessed to laterally expose an upper portion of the fins 104B. While the examples illustrated in FIGS. 10A/10B-21A/21B are shown and described with reference to a semiconductor device 300 including a dummy channel 902, it will be understood that embodiments of the present disclosure are equally applicable to embodiments where the dummy channel 902 is not formed (i.e., when an original material used to form the fins 104 is retained throughout the fabrication of the semiconductor device 300). The recessing process, as shown in FIG. 10A/10B, may include a dry etching process, a wet etching process, and/or a combination thereof. For example, the recessing process may include a dry, plasma-free process using a reaction gas or reaction gas combination, such as $HF+NH_3$, or plasma process, or a reaction gas combination, such as $NF_3+NH_3$, and/or other suitable reaction gases. In some embodiments, the dry, plasma-free recessing process is performed using a CERTAS® Gas Chemical Etch System, available from Tokyo Electron Limited, Tokyo, Japan. In some examples, the dry, plasma recessing process is performed using a SICONI® System, available from Applied Materials, Inc., Santa Clara, Calif. In other examples, the recessing process may include a wet etch performed using a dilute mixture of HF (e.g., 49% HF in $H_2O$ by weight) and de-ionized (DI) $H_2O$, where the $HF:H_2O$ ratio is approximately 1:50 or approximately 1:100. In some embodiments, a recessing depth is controlled (e.g., by controlling an etching time) so as to result in a desired height 'H' of an exposed upper portion of the fins 104B. In some embodiments, for example when a dummy channel 902 is formed at block 204, the exposed upper portion of the fins 104B includes the dummy channel 902. In some examples, for example when block 204 is omitted (i.e., the dummy channel 902 is not formed), the exposed upper portion of the fins 104B may include the same material as the substrate 102, such as Si, or other suitable substrate 102 material as listed above.

Figure 11A:
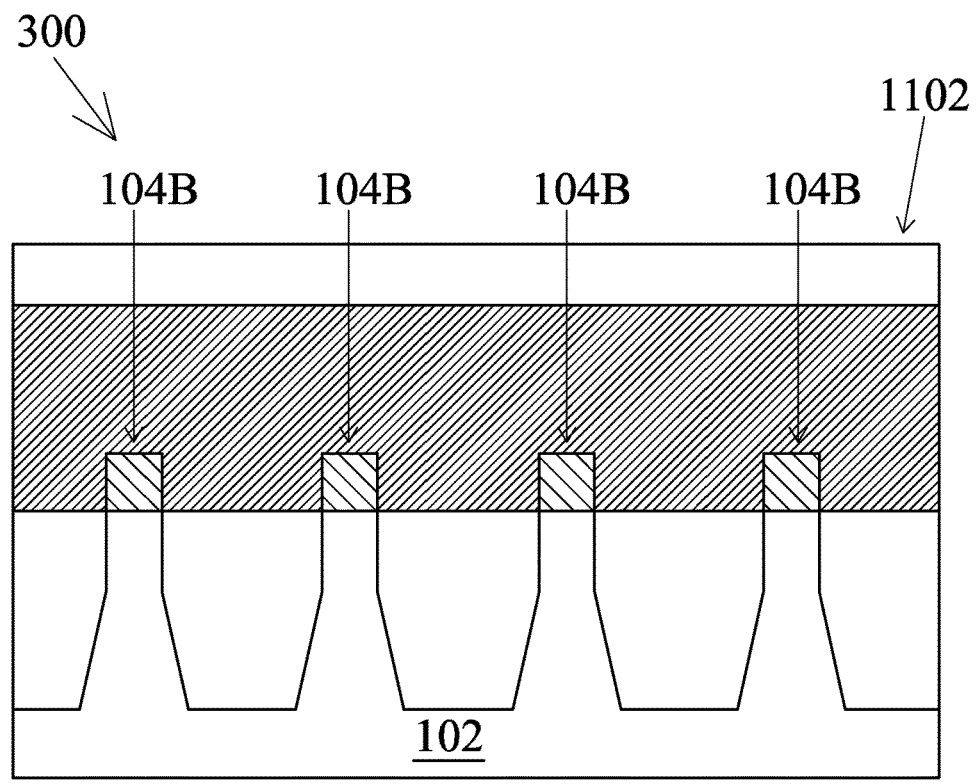
Figure 11B:
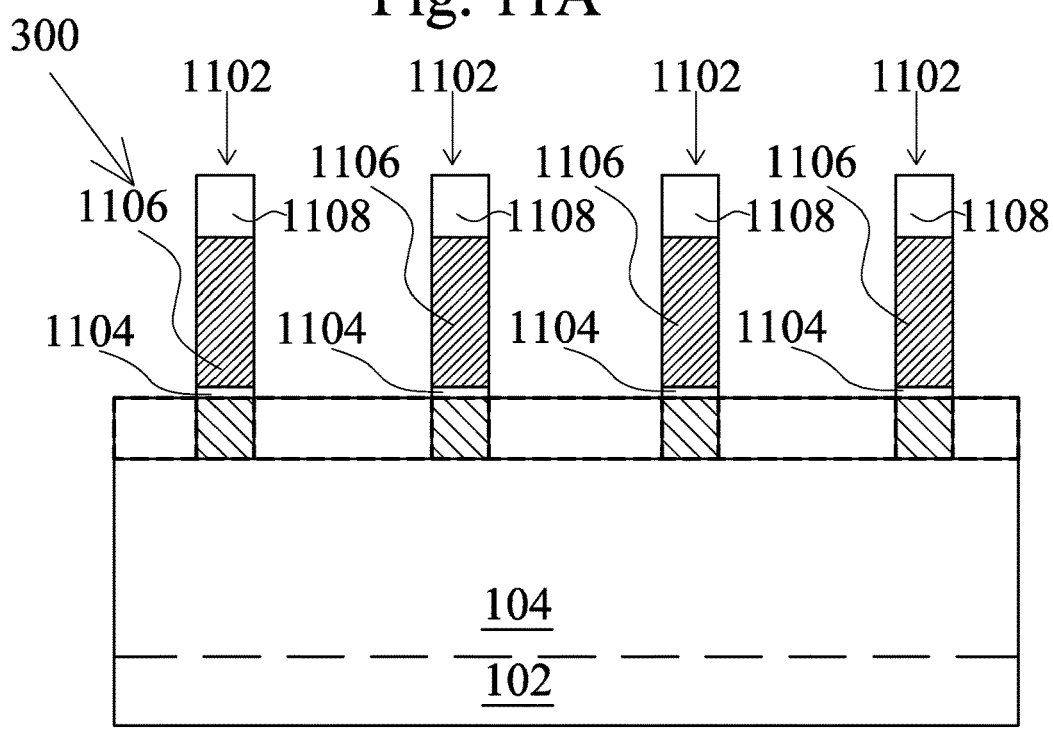

Referring now to FIG. 2, the method 200 proceeds to block 208 where a gate stack and sidewall spacers disposed on sidewalls of the gate stack are formed. In an embodiment, the gate stack is a dummy gate stack. In some examples of the method 200, the gate stack may be a metal gate structure. Referring to the example of FIGS. 11A/11B, and 12A/12B, a gate stack 1102 and sidewall spacers 1202 are formed on the device 300. While embodiments are described herein by way of an exemplary gate-last process, it will be understood that embodiments of the present disclosure are not limited to such a process. In some embodiments, various aspects of the present disclosure may be applicable to a gate-first process. In some examples, a gate-first process includes formation of a gate stack prior to source/drain formation or source/drain dopant activation. Merely by way of example, a gate-first process may include gate dielectric and metal gate depositions, followed by a gate stack etch process to define a gate critical dimension (CD). In some embodiments of a gate-first process, gate stack formation may be followed by source/drain formation including doping of source/drain regions and, in some examples, annealing for source/drain dopant activation.

In one embodiment using a gate-last process, the gate stack 1102 is a dummy gate stack and will be replaced by the final gate stack at a subsequent processing stage of the semiconductor device 300. In particular, the gate stack 1102 may be replaced at a later processing stage by a high-K dielectric layer (HK) and metal gate electrode (MG). In the illustrated embodiment, the gate stack 1102 is formed over the substrate 102 and is at least partially disposed over the fins 104B. In one embodiment, the gate stack 1102 includes a dielectric layer 1104, an electrode layer 1106, and a hard mask 1108. In some embodiments, the gate stack 1102 is formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In some embodiments, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE or ICP etching), wet etching, and/or other etching methods.

In some embodiments, the dielectric layer 1104 of the gate stack 1102 includes silicon oxide. Alternatively or additionally, the dielectric layer 1104 may include silicon nitride, a high-K dielectric material or other suitable material. In some embodiments, the electrode layer 1106 of the gate stack 1102 may include polycrystalline silicon (polysilicon). In some embodiments, the hard mask 1108 of the gate stack 1102 includes a suitable dielectric material, such as silicon nitride, silicon oxynitride or silicon carbide.

Figure 12A:
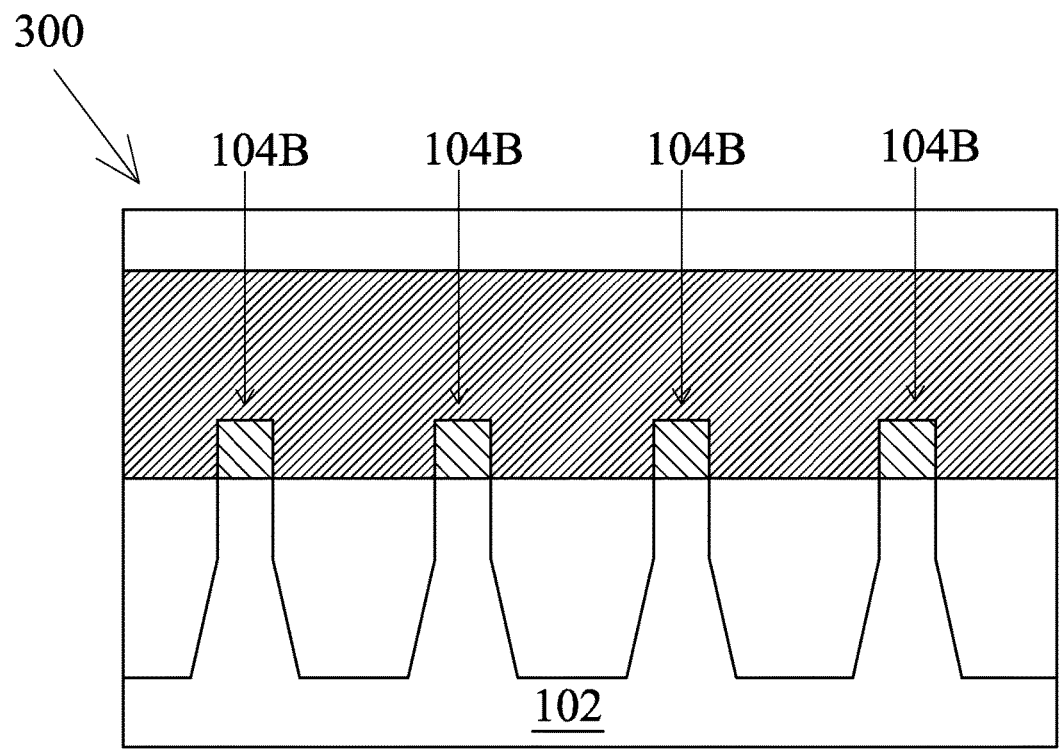
Figure 12B:
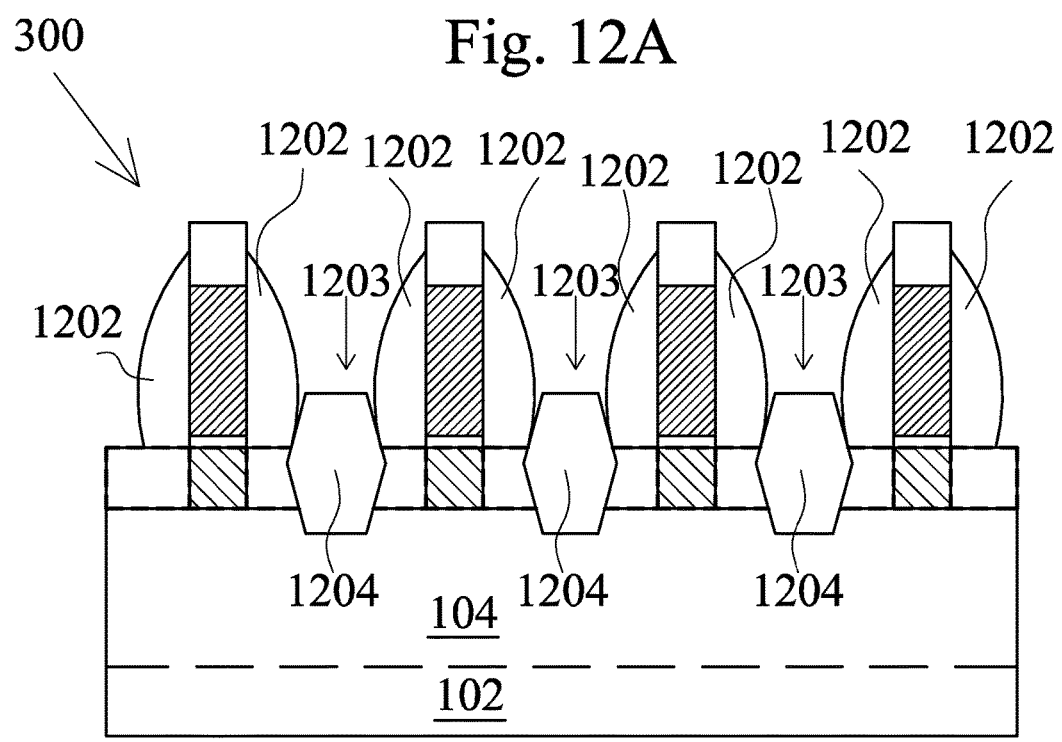

Referring to the example of FIG. 12A/12B, the sidewall spacers 1202 are disposed on the sidewalls of the gate stack 1102. The sidewall spacers 1202 may include a dielectric material such as silicon oxide, silicon nitride, silicon carbide, silicon oxynitride, or combinations thereof. In some embodiments, the sidewall spacers 1202 include multiple layers, such as main spacer walls, liner layers, and the like. By way of example, the sidewall spacers 1202 may be formed by depositing a dielectric material over the gate stack 1102 and anisotropically etching back the dielectric material. In some embodiments, the etch-back process (e.g., for spacer formation) may include a multiple-step etching process to improve etch selectivity and provide over-etch control. In some embodiments, prior to forming the sidewall spacers 1202, an ion implantation process may be performed to form lightly-doped drain (LDD) features within the semiconductor device 300. In some examples, such LDD features may be formed by in-situ doping prior to forming the sidewall spacers 1202. In yet other examples, an ion implantation process may be performed after forming the sidewall spacers 1202 to form the LDD features. After an implantation process, such as an LDD ion implantation process, the semiconductor device 300 may be subject to a high thermal budget process (anneal) to remove defects and activate dopants (i.e., to place dopants into substitutional sites). Thus, in embodiments of the present disclosure which include the dummy channel 902 (to be replaced at a later stage by the final channel), high thermal budget processes which are performed prior to replacement of the dummy channel 902 will have minimized degrading impact on the quality of the high-mobility channel material formed at a subsequent processing stage. Similarly, in embodiments which use a capping layer to protect previously formed high-mobility fin channels, the effect of high thermal budget processes (e.g., outgassing) is mitigated by the use of the capping layer.

Referring again to the method 200, the method 200 proceeds to block 210 where source/drain features are formed in source/drain regions. In some embodiments, the source/drain features are formed by epitaxially growing a semiconductor material layer in the source/drain regions. In some examples, dummy sidewall spacers may be formed prior to epitaxial source/drain growth and removed after epitaxial source/drain growth. Additionally, the main sidewall spacers (e.g., spacers 1202) may be formed, as described above, after epitaxial source/drain growth. In various embodiments, the semiconductor material layer grown in the source/drain regions includes Ge, Si, GaAs, AlGaAs, SiGe, GaAsP, SiP, or other suitable material.

Referring again to the example of FIG. 12A/12B, source/drain features 1204 are formed in the source/drain regions 1203 of the device 300. The source/drain features 1204 may be formed by one or more epitaxial (epi) processes. In some embodiments, the source/drain features 1204 may be in-situ doped during the epi process. For example, in some embodiments, epitaxially grown SiGe source/drain features 1204 may be doped with boron. In other examples, epitaxially grown Si epi source/drain features 1204 may be doped with carbon to form Si:C source/drain features, phosphorous to form Si:P source/drain features, or both carbon and phosphorous to form SiCP source/drain features. In some embodiments, the source/drain features 1204 are not in-situ doped, and instead an implantation process is performed to dope the source/drain features 1204. In various embodiments, a doping dose used to dope the source/drain features 1204 is greater than a doping dose used to dope the LDD features.

In some embodiments of the method 200, after forming the source/drain features (block 210), a low Schottky barrier height (SBH) layer may be formed over the source/drain features in the source/drain regions at block 211. In such embodiments, a capping layer may also be formed over the low SBH layer to mitigate outgassing of the high-mobility material layer used to form the low SBH layer. For example, in some embodiments, the low SBH layer may include one or more layers of a low SBH material such as a III-V material including GaAs, $In_xGa_{1-x}As$, Ni—InAs, and/or other suitable materials. Such low SBH material formed over the source/drain features (e.g., source/drain features 1204 of FIG. 12A/12B) may be used to reduce the barrier height (and contact resistance) between the source/drain features and a subsequently formed source/drain contact metal. In some embodiments, a buffer layer (e.g., an InP buffer layer) may be deposited over the source/drain features 1204 prior to deposition of the low SBH layer. In various embodiments, the capping layer formed over the low SBH layer is removed at a later processing stage of the semiconductor device 300. The method 200 then proceeds to block 212 where etch stop and dielectric layers are formed on the substrate 102.

Figure 13A:
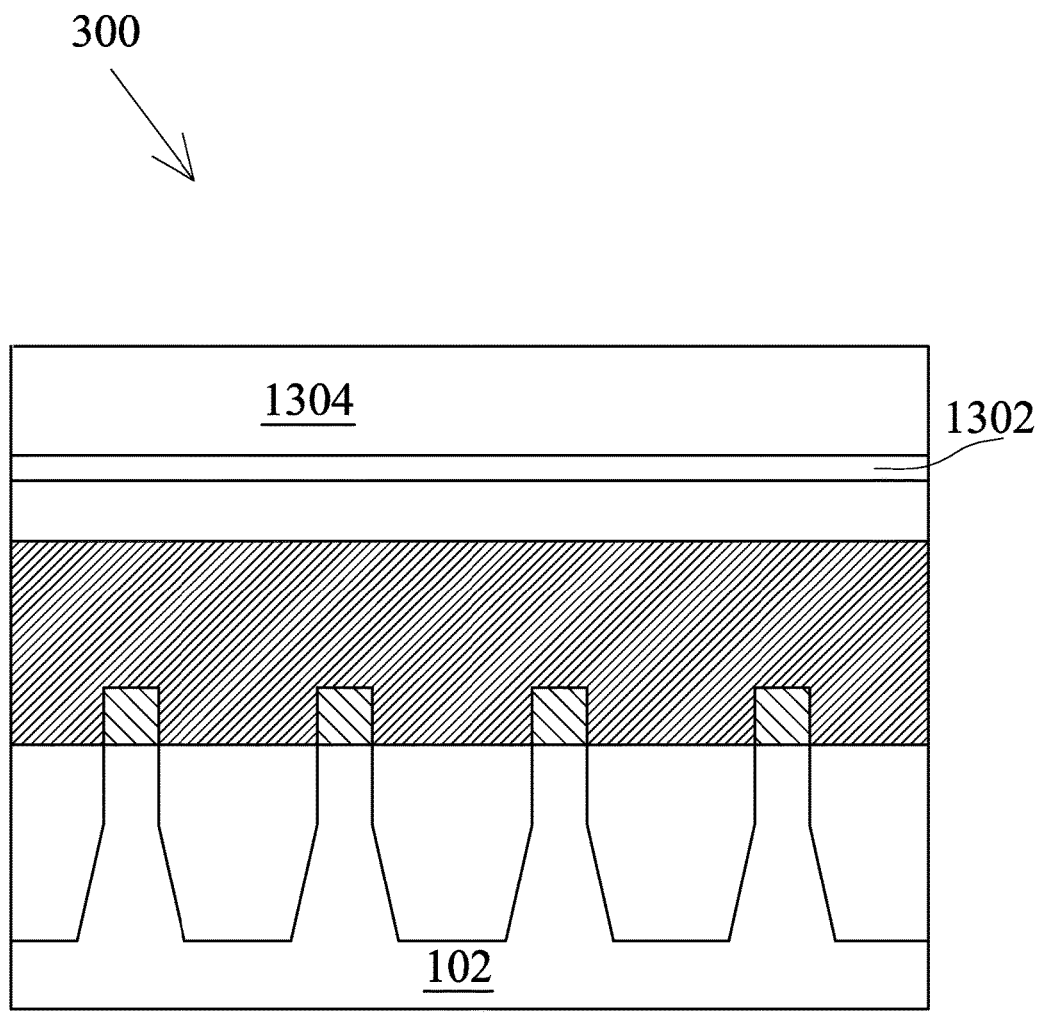
Figure 13B:
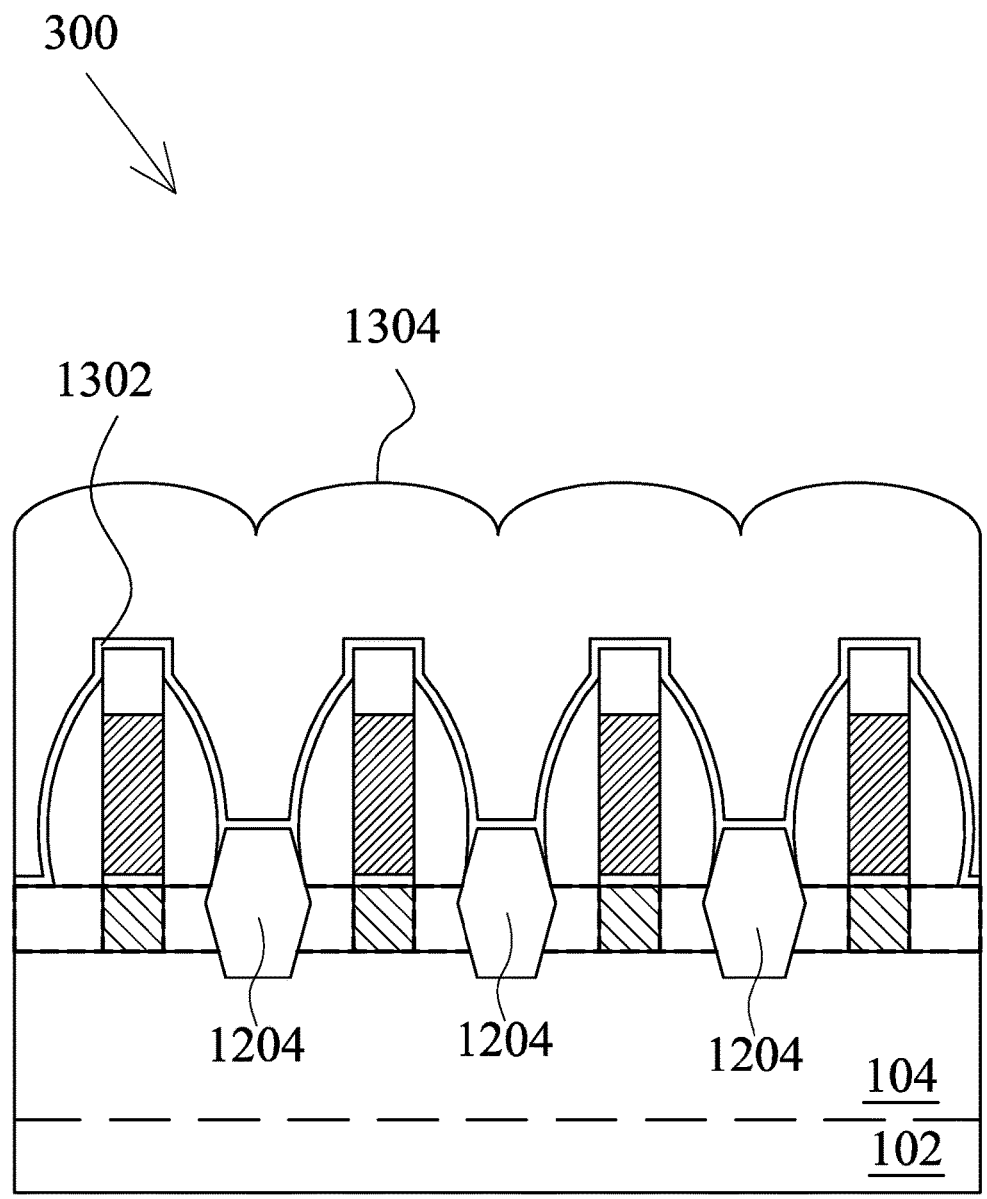

In some examples, after forming the source/drain features (block 210), the method 200 proceeds directly to block 212 where etch stop and dielectric layers are formed on the substrate 102. Referring to the example of FIG. 13A/13B, a contact etch stop layer (CESL) 1302 and an inter-layer dielectric (ILD) layer 1304 are formed over the substrate 102. In some examples, the CESL 1302 includes a silicon nitride layer, silicon carbon nitride layer, a silicon oxynitride layer, and/or other materials known in the art. The CESL 1302 may be formed by plasma-enhanced chemical vapor deposition (PECVD) process and/or other suitable deposition or oxidation processes. In some embodiments, the ILD layer 1304 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1304 may be deposited by a subatmospheric CVD (SACVD) process, a flowable CVD process, or other suitable deposition technique. In some embodiments, after formation of the ILD layer 1304, the semiconductor device 300 may be subject to a high thermal budget process to anneal the ILD layer 1304. Thus, in embodiments of the present disclosure which include the dummy channel 902, such high thermal budget anneal processes which are performed prior to the replacement of the dummy channel 902 will have no impact on the quality of the high-mobility channel material formed at a subsequent processing stage. Similarly, in embodiments which use a capping layer to protect previously formed high-mobility fin channels, the effect of such a high temperature anneal (e.g., outgassing) is mitigated by the use of the capping layer.

Figure 14A:
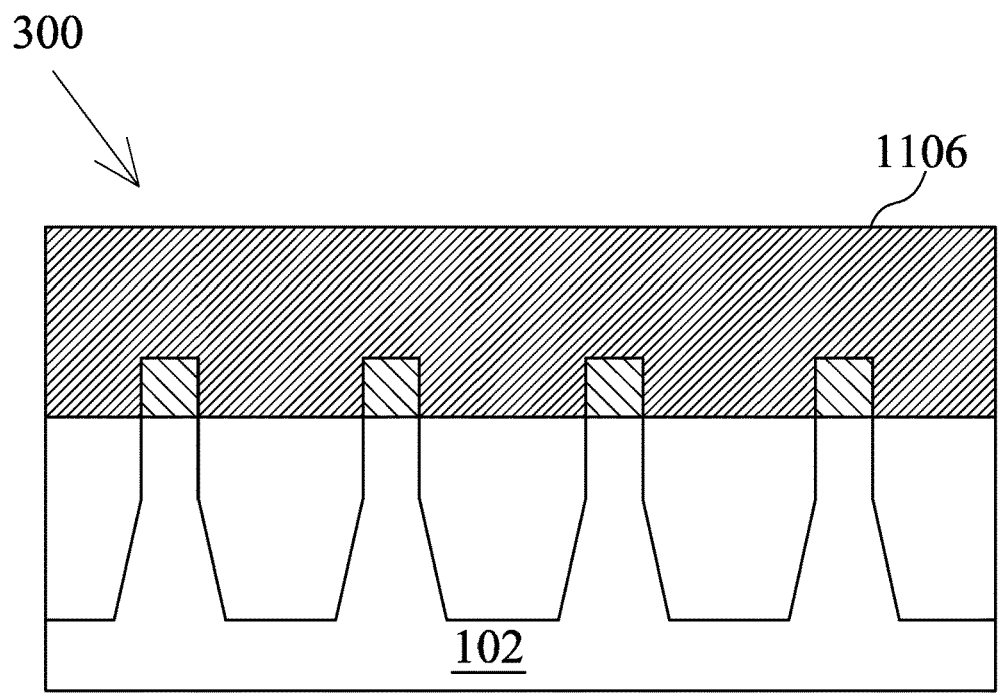

After forming the CESL 1302 and ILD layer 1304, and with reference to FIG. 14A/14B, a planarization process is performed to expose a top surface of the dummy gate stack 1102. For example, a planarization process includes a chemical mechanical planarization (CMP) process which removes portions of the CESL 1302 and ILD layer 1304 overlying the dummy gate stack 1102 and planarizes a top surface of the semiconductor device 300. In addition, the CMP process removes the hard mask 1108 overlying the dummy gate stack 1102 to expose the electrode layer 1106.

Figure 14B:
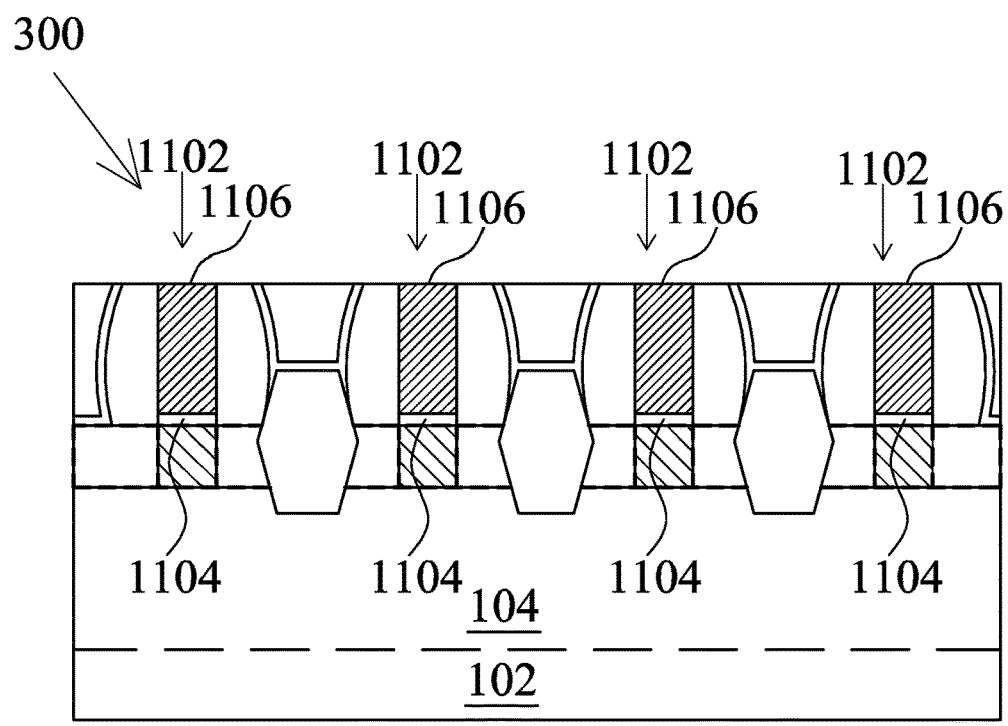
Figure 15A:
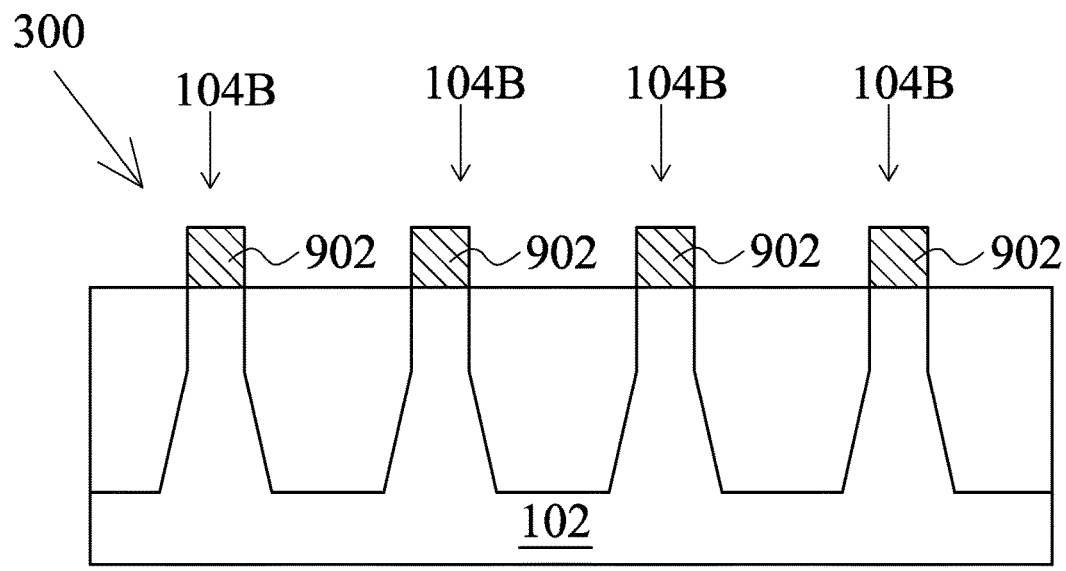
Figure 15B:
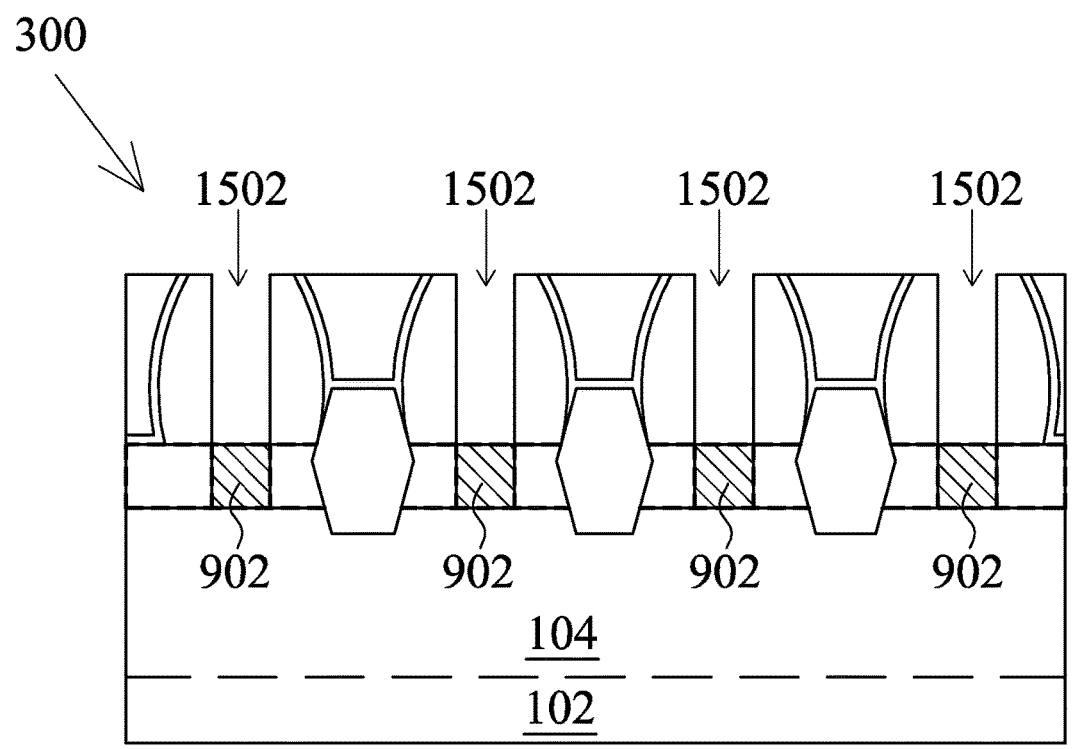

In an embodiment, the method 200 then proceeds to block 214 where the gate stack features (e.g., dummy gate stack) are removed from the substrate. The removal of the gate stack features (e.g., the dielectric layer and/or the electrode layer) from the gate stack may result in a trench, and a final gate structure (e.g., including a high-K dielectric layer and metal gate electrode) may be subsequently formed in the trench. The removal of the dummy gate stack features may include a selective etch process including a selective wet etch or a selective dry etch. Referring to the example of FIG. 15A/15B, the gate stack 1102 is a dummy gate stack having features including the dielectric layer 1104 (FIG. 14B) and the electrode layer 1106 (FIG. 14B), which have been removed from the substrate 102, thereby providing a trench 1502. The trench 1502 may define a region in which the final gate structure can be formed, as described in further detail below. In some embodiments, if a capping layer was previously deposited over the channel layer (e.g., at block 205), then the capping layer may be removed (e.g., by wet or dry etching) once the gate stack 1102 features are removed.

Figure 16A:
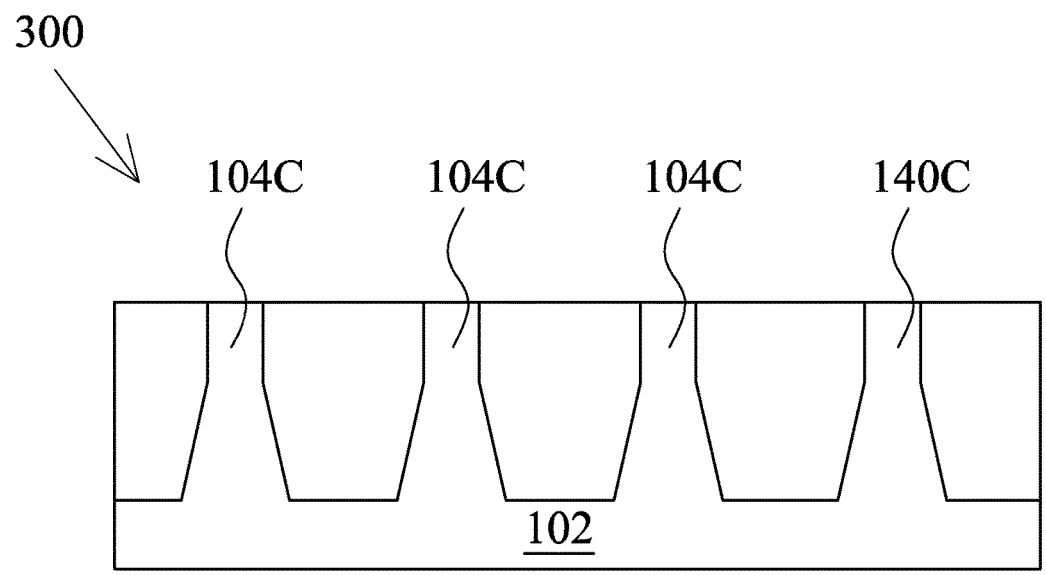
Figure 16B:
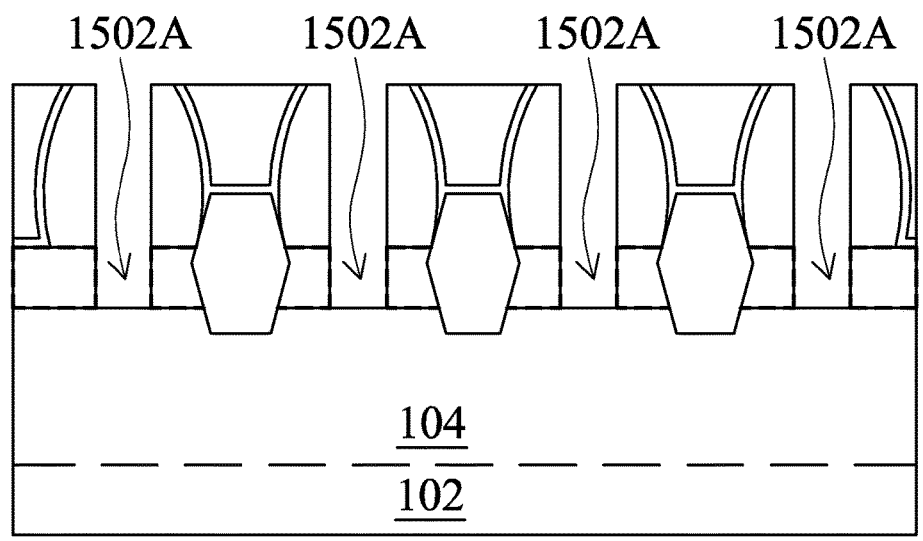

In an embodiment, if a dummy channel layer (e.g., dummy channel 902 of FIG. 9A/9B) was formed in block 204, then the method 200 proceeds to block 216 where the dummy channel layer is removed and subsequently replaced by a final channel material as described below. Referring to the example of FIG. 16A/16B, the dummy channel layer 902 has been removed by a selective wet etch or a selective dry etch process, resulting in a trench 1502A and resulting in fins 104C. In some embodiments, fins 104C may be substantially the same as recessed fins 104A (FIG. 8A). In some examples, a solution of $NH_4OH:H_2O_2:H_2O$ may be used as a selective wet etch for $Si_{1-x}Ge_x$ alloys, as may be used for the dummy channel layer 902. In other examples, a selective dry etch includes a selective reactive ion etch using $SF_6:O_2$ or $CF_4:O_2$ etch chemistries, which is also an effective etch for $Si_{1-x}Ge_x$ alloys. Other suitable techniques as known in the art, such as an inductively coupled plasma (ICP) etching technique, may also be used to remove the dummy channel layer 902.

Figure 17A:
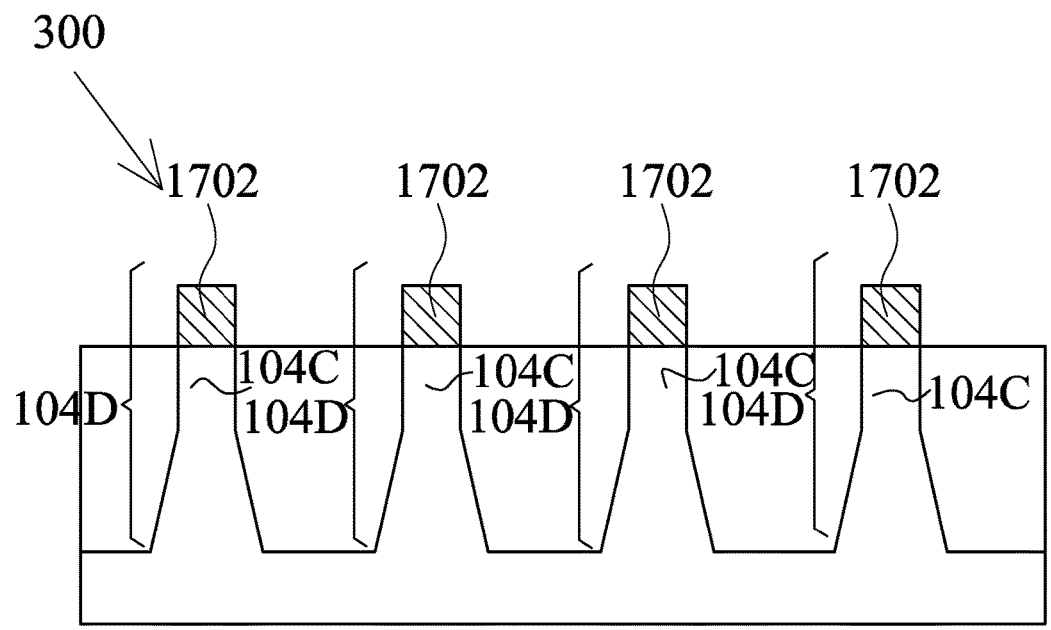
Figure 17B:
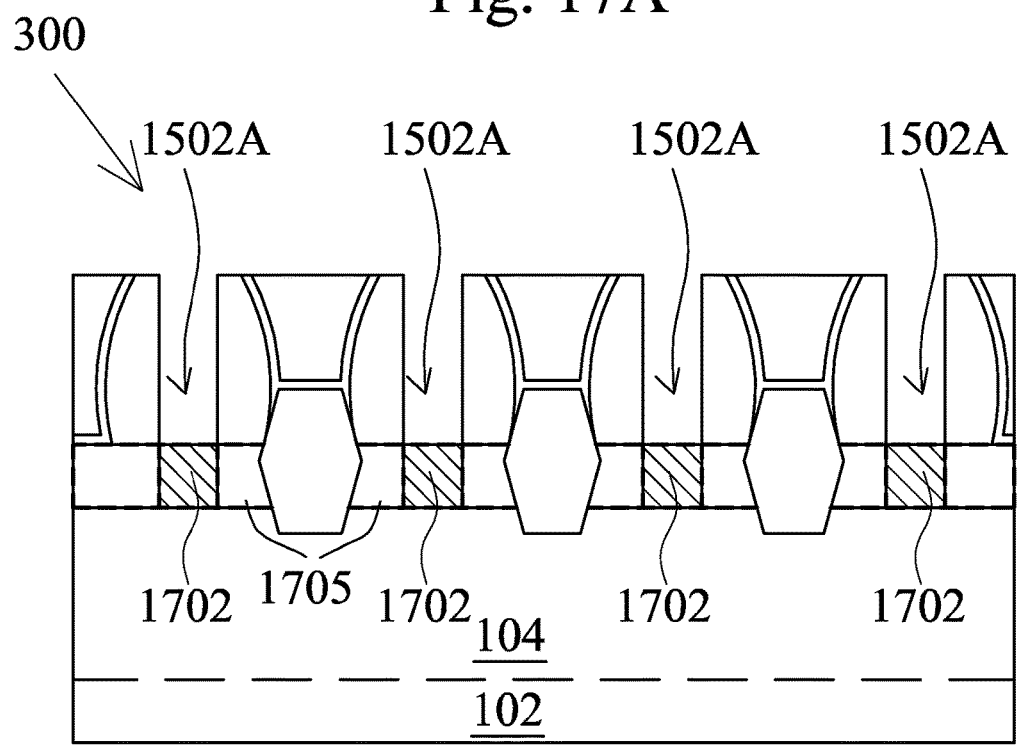

In an embodiment of the method 200, after removal of the dummy channel layer, the method 200 proceeds to block 218 where a final transistor channel material is regrown. With reference to FIG. 17A/17B, a channel material 1702 is regrown within the trench 1502A and over an end portion of fins 104C, and will form the transistor channel (i.e., FinFET channel) of the semiconductor device 300. Thus, the channel region of a transistor, disposed within the fin 104D, includes the channel material 1702. In various embodiments, the channel material 1702 is regrown using an epitaxial growth process such as molecular beam epitaxy (MBE), metalorganic chemical vapor deposition (MOCVD), and/or other suitable regrowth process. By way of example, the regrown channel material 1702 may include any of a plurality of high-mobility semiconductor materials such as SiGe, strained Ge, Ge, GaAs, GaP, InP, InAs, InSb, GaAsP, AlInAs, AlGaAs, InGaAs, GaInP, and/or GaInAsP, or combinations thereof. Additionally, in some embodiments, the channel material 1702 may be in-situ doped during the epitaxial growth process.

It should be noted for clarity of discussion that the regrown channel material 1702 may include a material having a different composition than a composition of any of the substrate 102 composition, the original fin 104 composition (e.g., after fin formation as shown in FIG. 4A/4B), the original device 300 channel composition (e.g., prior to recessing the fin 104), or the dummy channel 902 composition. Moreover, in some embodiments, the regrown channel material 1702 may include a material having a different composition than a composition of regions 1705 disposed between the regrown channel material 1702 and source/drain features 1204. In some examples, the regrown channel material 1702 may include a material having the same or similar composition as the composition of any of the substrate 102 composition, the original fin 104 composition (e.g., after fin formation as shown in FIG. 4A/4B), the original device 300 channel composition (e.g., prior to recessing the fin 104), or the dummy channel 902 composition. Likewise, in some embodiments, the regrown channel material 1702 may include a material having the same or similar composition as the composition of the regions 1705 disposed between the regrown channel material 1702 and source/drain features 1204.

Figure 18A:
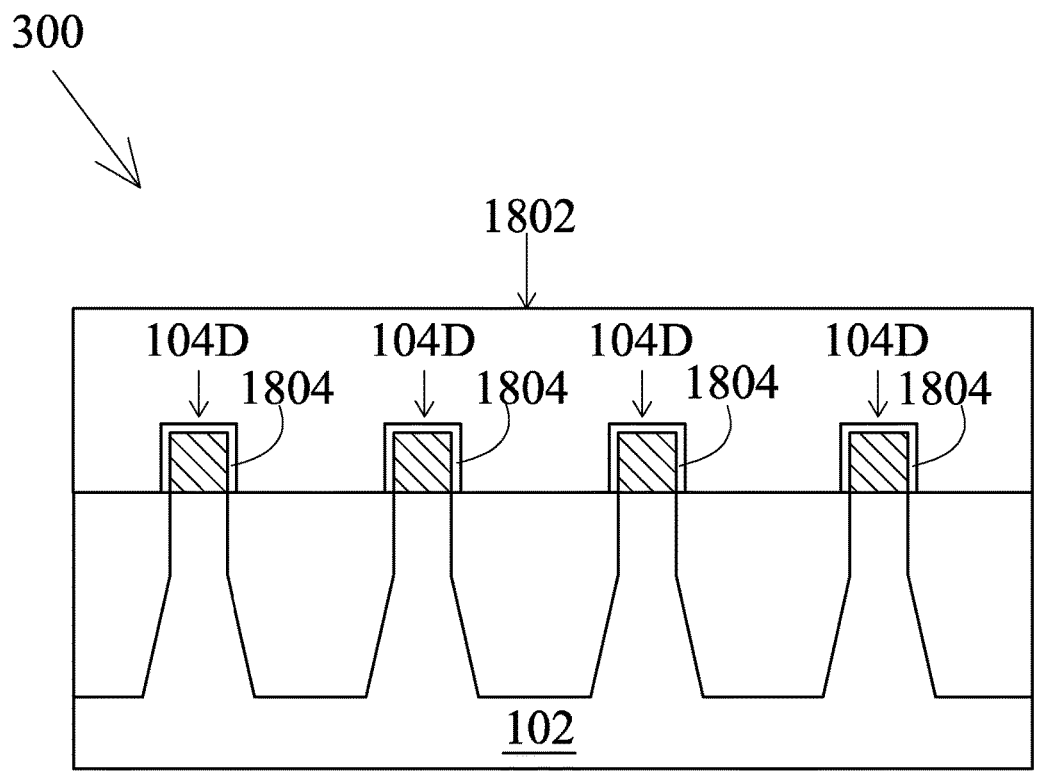
Figure 18B:
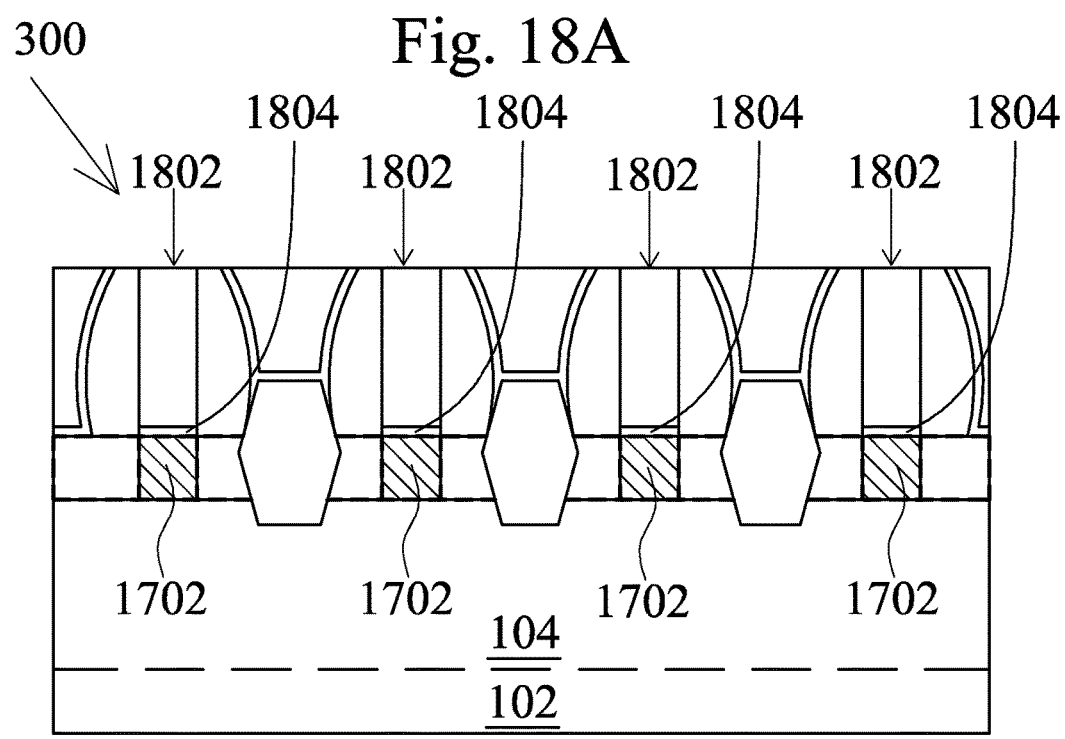

The method 200 then proceeds to block 220 where a high-K/metal gate stack is formed. In some embodiments, the dummy channel removal/channel regrowth processes of blocks 216 and 218 may be omitted (e.g., if a dummy channel was not formed at block 204), and the method 200 may proceed directly to block 220 from block 214. In either case, a high-K/metal gate stack is formed at block 220. Referring to the example of FIG. 18A/18B, a high-K metal gate stack 1802 is formed on the device 300. The high-K/metal gate stack 1802 includes an interfacial layer 1804 formed over the high-mobility channel material 1702 of the fin 104D, a high-K gate dielectric layer formed over the interfacial layer 1804, and a metal layer formed over the high-K gate dielectric layer. High-K gate dielectrics, as used and described herein, include dielectric material having a high dielectric constant, for example, greater than that of thermal silicon oxide (~3.9). The metal layer used within high-K/metal gate stack 1802 may include a metal, metal alloy, or metal silicide. Additionally, the formation of the high-K/metal gate stack 1802 includes depositions to form various gate materials and one or more CMP processes to remove excessive gate materials and thereby planarize a top surface of the semiconductor device 300.

The interfacial layer 1804 may include a dielectric material such as silicon oxide ($SiO_2$), HfSiO, or silicon oxynitride (SiON). The interfacial layer 1804 may be formed by chemical oxidation, thermal oxidation, atomic layer deposition (ALD), chemical vapor deposition (CVD), and/or other suitable method. The gate dielectric layer of the high-K/metal gate stack 1802 may include a high-K dielectric layer such as hafnium oxide ($HfO_2$). Alternatively, the gate dielectric layer of the high-K/metal gate stack 1802 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods. The metal layer of the high-K/metal gate stack 1802 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer of the high-K/metal gate stack 1802 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. The metal layer of the high-K/metal gate stack 1802 may be formed by ALD, PVD, CVD, e-beam evaporation, or other suitable process. Further, the metal layer of the high-K/metal gate stack 1802 may be formed separately for N-FET and P-FET transistors which may use different metal layers. In various embodiments, a CMP process may be performed to remove excessive metal from the metal layer of the high-K/metal gate stack 1802, and thereby provide a substantially planar top surface of the metal layer of the high-K/metal gate stack 1802.

Figure 19A:
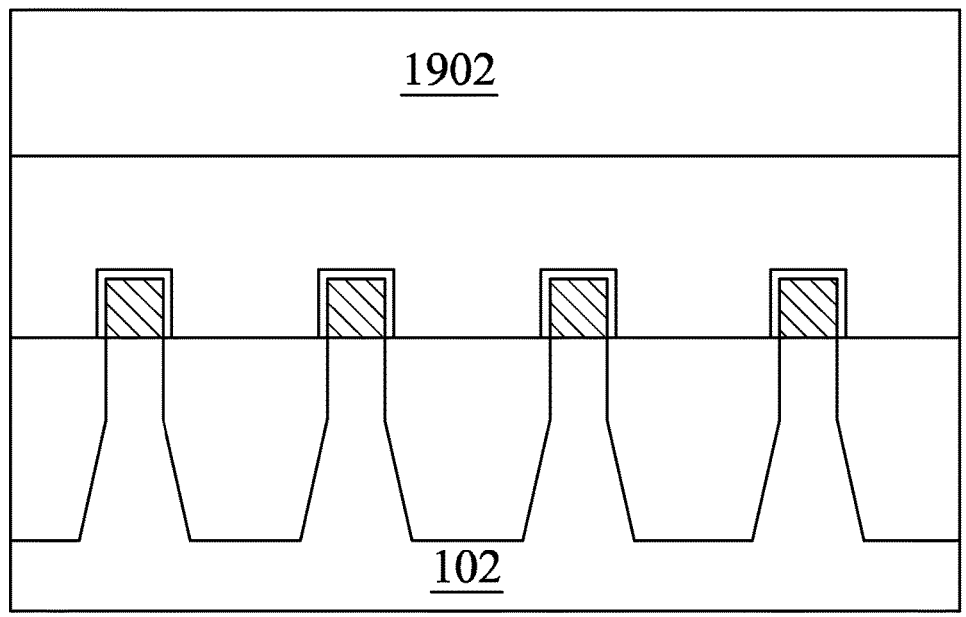
Figure 19B:
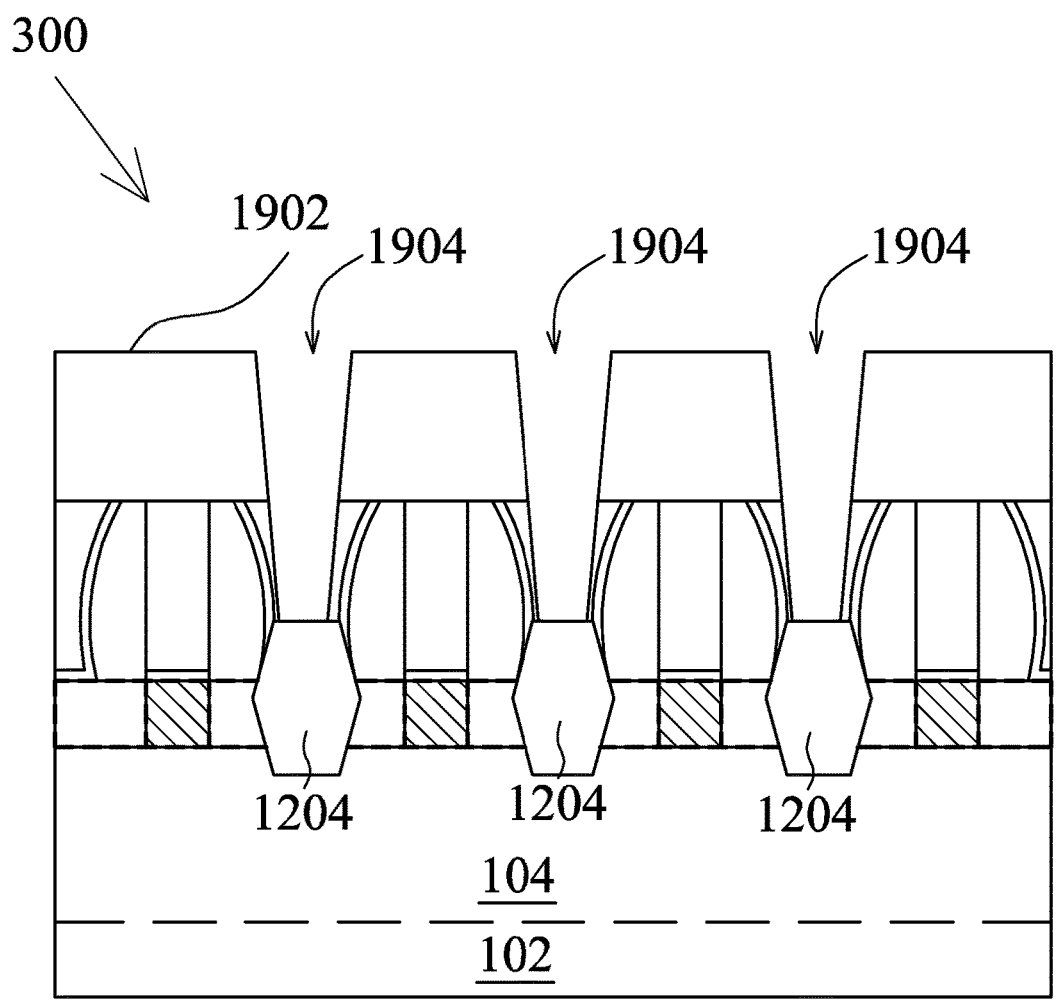

The method 200 then proceeds to block 222 where an interlayer dielectric (ILD) layer is formed over the substrate 102. Referring to the example of FIG. 19A/19B, an ILD layer 1902 is formed over the substrate 102. In some embodiments, the ILD layer 1902 includes silicon oxide, silicon oxynitride, a low-K dielectric material or other suitable dielectric material. In some embodiments, the ILD layer 1902 may include a single layer or multiple layers. By way of example, the ILD layer 1902 may be formed by any of a plurality of suitable techniques including CVD, ALD, and spin-on techniques (e.g., for depositing spin-on-glass). In some embodiments, a CMP process may be performed thereafter to remove excess material from the ILD layer 1902 and planarize the top surface of the semiconductor device 300.

Referring still to block 222 of the method 200, contact openings are formed for the device. Referring to the example of FIG. 19A/19B, source/drain contact openings 1904 are formed to provide access to the source/drain features 1204 formed in the source/drain regions 1203. By way of example, the source/drain contact openings 1904 may be formed by a suitable combination of lithographic patterning and etching (e.g., wet or dry etching) processes. In some embodiments, if a capping layer was previously deposited over the source/drain features 1204 (e.g., at block 211), then the capping layers may be removed (e.g., by wet or dry etching) once the source/drain contact openings 1904 are formed.

Figure 20A:
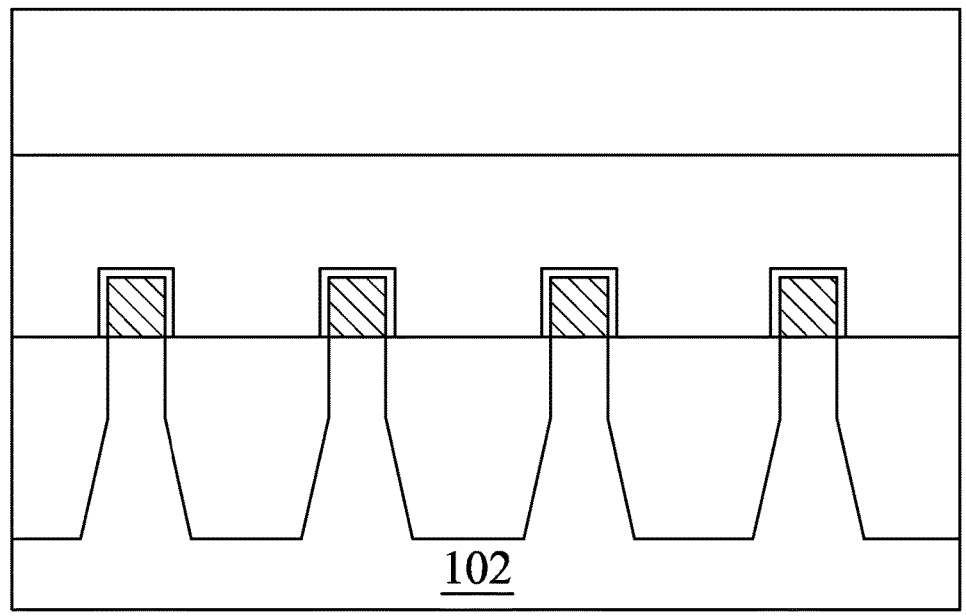
Figure 20B:
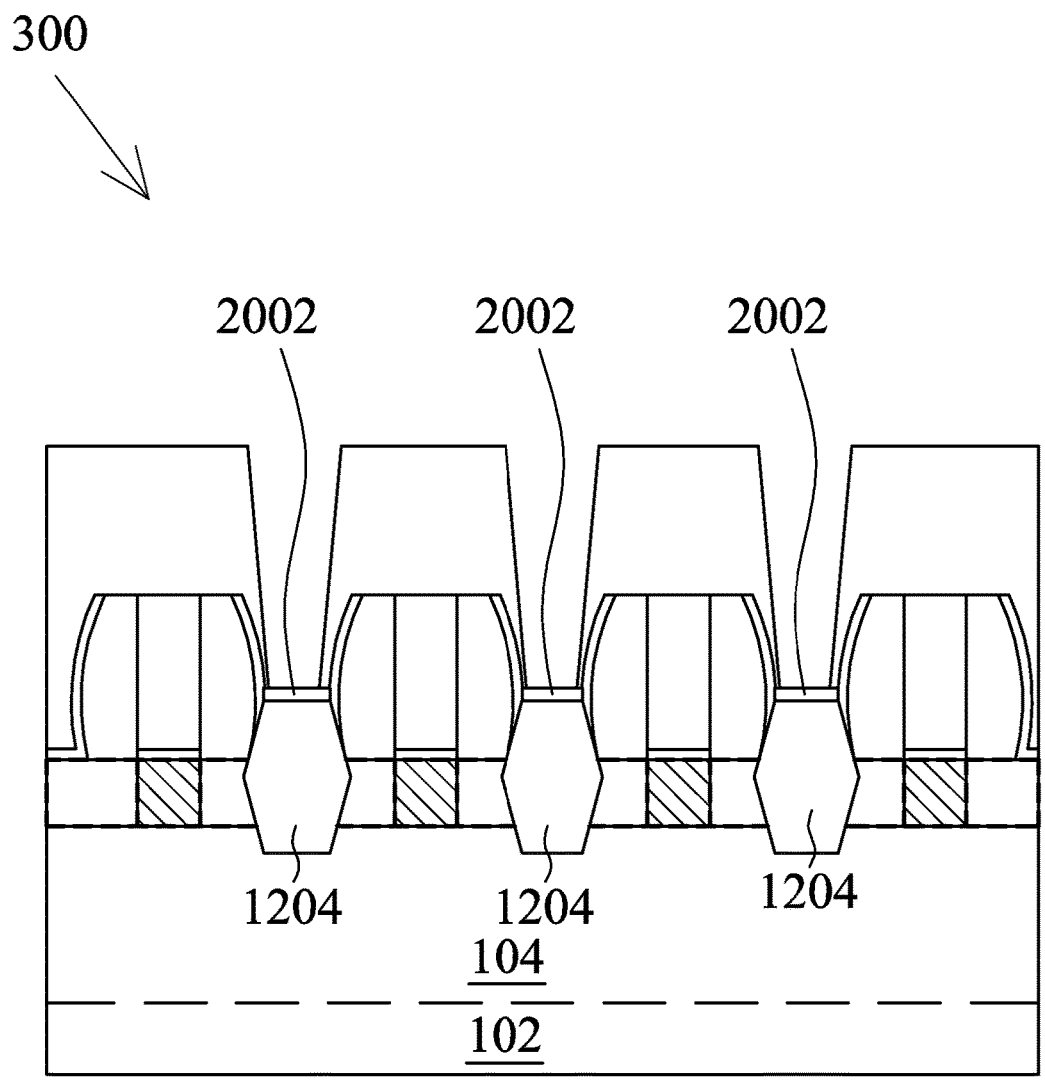

In some embodiments, after forming the source/drain contact openings (e.g., openings 1904) and if a low SBH layer was not previously formed at block 211, the method 200 proceeds to block 224 where a low SBH layer is formed over the source/drain features (e.g., 1204) in the source/drain regions (e.g., 1203). Referring to the example of FIG. 20A/20B, a low SBH layer 2002 is formed over the source/drain features 1204. In some embodiments, the SBH layer 2002 includes one or more layers of a low SBH material such as a III-V material including GaAs, $In_xGa_{1-x}As$, Ni—InAs, and/or other suitable materials. The low SBH material formed over the source/drain features 1204 may be advantageously used to reduce the barrier height (and thus reduce the contact resistance) between the source/drain features 1204 and a subsequently formed source/drain contact metal. In some embodiments, a buffer layer (e.g., an InP buffer layer) may be deposited over the source/drain features 1204 prior to deposition of the low SBH layer.

Figure 21A:
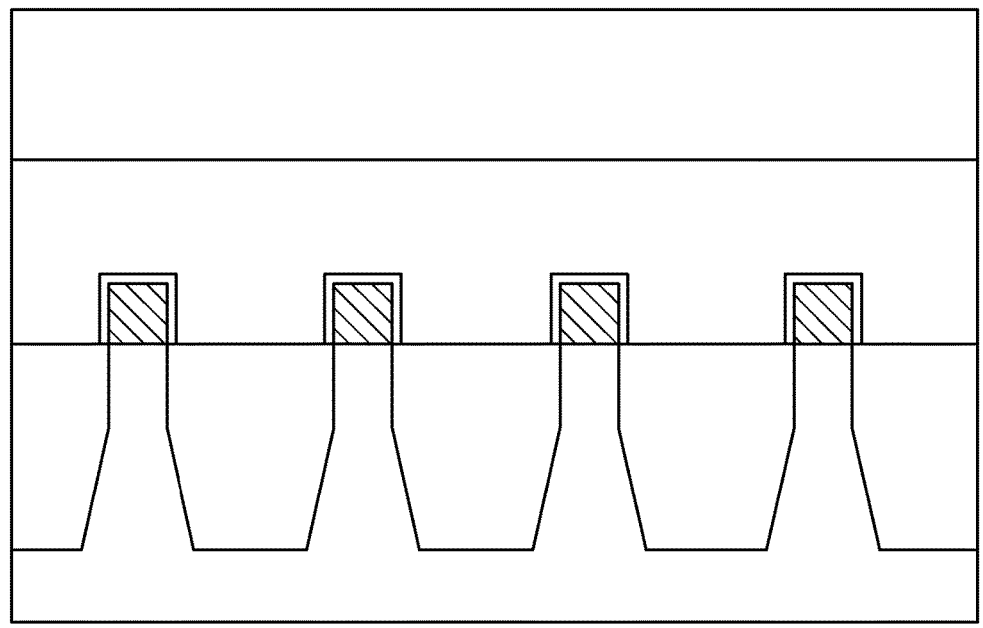
Figure 21B:
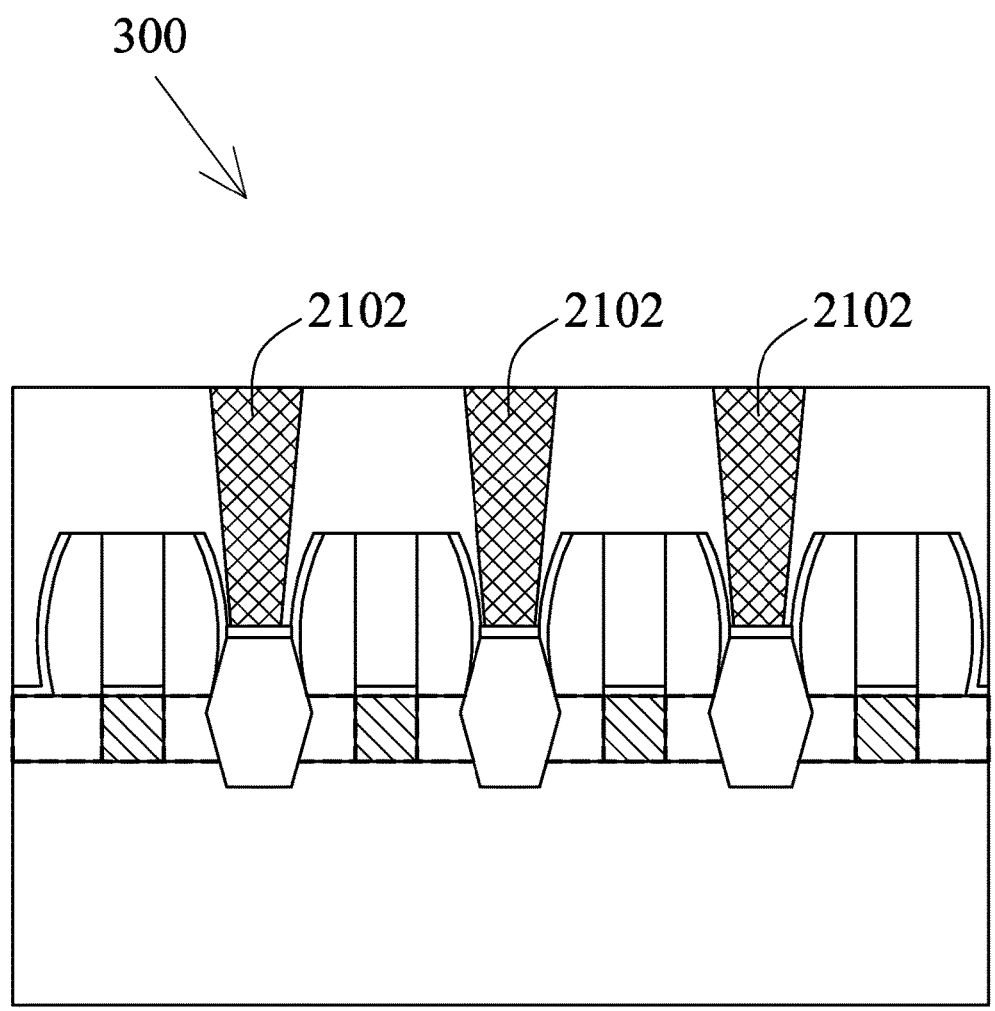

The method 200 then proceeds to block 226 where a source/drain contact metal is formed within the source/drain contact openings described above with reference to block 222. In some embodiments of the method 200, formation of the low SBH layer (block 224) may be omitted, and the process may proceed directly to block 226. In either case, with reference to the example of FIG. 21A/21B, a source/drain contact metal 2102 is formed, for example by a suitable combination of layer deposition, lithographic patterning and etching (e.g., wet or dry etching) processes. In some embodiments, the source/drain contact metal 2102 may be coupled to the source/drain features 1204 by way of the SBH layer 2002. In some examples, the source/drain contact metal 2102 is directly coupled to the source/drain features 1204.

The semiconductor device 300 may undergo further processing to form various features and regions known in the art. For example, subsequent processing may form various contacts/vias/lines and multilayers interconnect features (e.g., metal layers and interlayer dielectrics) on the substrate 102, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Moreover, additional process steps may be implemented before, during, and after the method 200, and some process steps described above may be replaced or eliminated in accordance with various embodiments of the method 200. With respect to the description provided herein, the present disclosure offers methods for protecting high-mobility materials in semiconductor devices from exposure to high thermal budget process, so as to minimize degradation of such materials and related devices. In some aspects, a high-mobility transistor channel layer (e.g., a III-V layer, a Ge layer, or other high-mobility layer) and/or a high-mobility SBH layer is formed at a late stage of a transistor fabrication process flow, in order to reduce exposure of the high-mobility material to the high thermal budget processes encountered during various fabrication stages of a semiconductor device (e.g., a FinFET device). In some embodiments, a capping layer may alternatively be formed over a high-mobility transistor channel layer and/or a high-mobility SBH layer, for example to prevent outgassing of the layer. In particular, the various embodiments of the present disclosure advantageously prevent and/or protect high-mobility material layers from high-temperature processing induced damage, such that high-temperature processes have a significantly mitigated impact on the quality of the high-mobility material used for device fabrication.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and systems for protecting high-mobility materials from exposure to high thermal budget process, so as to minimize degradation of such materials upon exposure to high temperatures. In some embodiments, a high-mobility transistor channel layer is formed at a late stage of a transistor fabrication process flow, in order to reduce exposure of the high-mobility channel layer to the high thermal budget processes encountered during various fabrication stages. In some examples, a high-mobility SBH layer may also be formed at a late stage of transistor fabrication, in order to prevent exposure of the SBH layer to high temperatures. In some cases, both the high-mobility transistor channel layer and the high-mobility SBH layer are formed at a late stage of a transistor fabrication process flow. A capping layer may also be formed over the high-mobility transistor channel layer and/or the high-mobility SBH layer, for example to prevent outgassing of the layer. In sum, the methods and devices described herein provide for protecting high-mobility materials from exposure to high thermal budget processes.

Thus, one of the embodiments of the present disclosure described a method for fabricating a semiconductor device (e.g., a FinFET device), and in particular for protecting high-mobility materials from exposure to high temperature processes. In some embodiments, the method includes providing a substrate having a fin extending from the substrate. In various embodiments, a source region and a drain region are formed in the fin. One or more high-temperature processes (e.g., implant anneals, dielectric anneal, and/or spacer deposition) may be performed on the substrate having the fin. By way of example, after forming the source and drain regions in the fin, and in some examples after performing one or more high-temperature processes, a material having a mobility greater than silicon (e.g., a high-mobility material) is formed in a channel region of the fin or on the source and drain regions.

In another of the embodiments, discussed is a method where a substrate including at least one fin extending therefrom is provided. In various embodiments, the at least one fin includes a dummy channel and source/drain regions, and a dummy gate stack is formed over the dummy channel. In some embodiments, a first inter-layer dielectric (ILD) layer is formed on the substrate including the fin. Illustratively, the first ILD layer is planarized to expose the dummy gate stack. In some embodiments, after planarizing the first ILD layer, the dummy gate stack and the dummy channel are removed (e.g., etched) to form a recess in the fin, and a material (e.g., a high-mobility material) is formed in the recess, where the recess may include a FinFET channel region. In some embodiments, after regrowing the high-mobility material channel region, contact openings are formed within a second ILD layer overlying the source/drain regions, and a low Schottky barrier height (SBH) material is formed over the source/drain regions.

In yet another of the embodiments, discussed is a semiconductor device including a substrate having a fin, a gate stack formed over a first region of the fin, and a spacer formed abutting a sidewall of the gate stack. Additionally, in some embodiments, the spacer is formed over a second region of the fin disposed adjacent to and interfacing with the first region. In some embodiments, the first region includes a first material and the second region includes a second material different than the first material. In some examples, the first material is an epitaxially regrown high-mobility material. As such, in some examples, the first material has a higher-mobility than the second material. In some embodiments, the fin further includes a source region and a drain region, where the source and drain regions further include a low Schottky barrier height (SBH) layer formed over the source and drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   providing a substrate including a plurality of fins extending therefrom and a plurality of isolation regions interposing the plurality of fins;
   after providing the substrate including the plurality of fins, forming a channel layer on an end portion of each of the plurality of fins, wherein the channel layer has a different composition than each of the plurality of fins;
   recessing the plurality of isolation regions to expose an upper portion of each of the plurality of fins including the channel layer;
   after recessing the plurality of isolation regions, forming a source region and a drain region in each of the plurality of fins;
   after forming the source region and the drain region in each of the plurality of fins, removing the channel layer to expose the end portion of each of the plurality of fins; and
   forming a first material that has a mobility greater than silicon over the exposed end portion of each of the plurality of fins.

2. The method of claim 1, further comprising:
   depositing a dielectric layer over the substrate;
   patterning the dielectric layer to expose the source and drain regions and thereby provide access to each of the source and drain regions; and
   forming a second material that has a mobility greater than silicon over the exposed source and drain regions.

3. The method of claim 2, wherein the second material that has a mobility greater than silicon includes a low Schottky barrier height (SBH) layer.

4. The method of claim 3, wherein the low Schottky barrier height (SBH) layer includes at least one selected from the group comprising: a GaAs layer; an $In_xGa_{1-x}As$ layer; and a Ni—InAs layer.

5. The method of claim 3, wherein the low Schottky barrier height (SBH) layer provides a reduced source/drain contact resistance.

6. The method of claim 2, further comprising:
   prior to forming the second material that has a mobility greater than silicon, forming a buffer layer over the exposed source and drain regions.

7. The method of claim 2, further comprising:
   forming a source/drain contact metal over the second material that has a mobility greater than silicon.

8. The method of claim 7, wherein the source/drain contact metal includes at least one material selected from the group comprising: copper; tungsten; and a silicide.

9. The method of claim 2, further comprising:
   forming a capping layer over at least one of the first and second materials that have a mobility greater than silicon; and
   after forming the capping layer, performing an annealing process, wherein the capping layer protects the at least one of the first and second materials that have a mobility greater than silicon during the annealing process.

10. The method of claim 9, further comprising after performing the annealing process, removing the capping layer.

11. The method of claim 1, wherein the first material that has a mobility greater than silicon includes at least one selected from the group comprising: SiGe; strained Ge; Ge; GaAs; GaP; InP; InAs; InSb; GaAsP; AlInAs; AlGaAs; InGaAs, GaInP; and GaInAsP.

12. The method of claim 1, further comprising:
   after recessing the plurality of isolation regions and prior to forming the source region and the drain region, forming a dummy gate stack over the exposed upper portion of each of the plurality of fins including the channel layer.

13. The method of claim 12, further comprising:
   after forming the source region and the drain region and prior to removing the channel layer, removing the dummy gate stack to expose the channel layer.

14. A method, comprising:
   providing a substrate including a plurality of fins and interposing dielectric features;
   after providing the plurality of fins and interposing dielectric features, forming a dummy channel on an end of each of the plurality of fins, wherein the dummy channel has a different composition than each of the plurality of fins;
   recessing the interposing dielectric features to expose the dummy channel;

after recessing the interposing dielectric features, forming a dummy gate stack over the exposed dummy channel and forming source/drain regions in each of the plurality of fins;

depositing a first inter-layer dielectric (ILD) layer on the substrate including the plurality of fins;

planarizing the first ILD layer to expose the dummy gate stack;

after planarizing the first ILD layer, removing the dummy gate stack and etching the dummy channel to form a recess in each of the plurality of fins; and forming a material in the recess in each of the plurality of fins.

15. The method of claim 14, wherein the material includes at least one material that has a mobility greater than silicon selected from the group comprising: SiGe; strained Ge; Ge; GaAs; GaP; InP; InAs; InSb; GaAsP; AlInAs; AlGaAs; InGaAs, GaInP; GaInAsP; and combinations thereof.

16. The method of claim 14, further comprising prior to planarizing the first ILD layer, annealing the first ILD layer.

17. The method of claim 14, further comprising:
after forming the material in the recess, forming a low Schottky barrier height (SBH) material over the source/drain regions in each of the plurality of fins.

18. The method of claim 17, wherein the low Schottky barrier height (SBH) material includes at least one material selected from the group comprising: GaAs; $In_xGa_{1-x}As$; and Ni—InAs.

19. The method of claim 17, further comprising:
forming a source/drain contact metal over the low Schottky barrier height (SBH) material, wherein the source/drain contact metal includes at least one material selected from the group comprising: copper; tungsten; and a silicide.

20. The method of claim 17, further comprising:
forming a capping layer over at least one of the material in the recess and the low SBH material;
after forming the capping layer, performing an annealing process, wherein the capping layer protects the at least one of the material in the recess and the low SBH material during the annealing process; and
after performing the annealing process, removing the capping layer.

* * * * *